United States Patent
Wu et al.

(10) Patent No.: US 12,432,011 B2
(45) Date of Patent: Sep. 30, 2025

(54) FORWARD ERROR CORRECTION ENCODING WITH RELIABILITY DIFFERENTIATION

(71) Applicant: QUALCOMM Incorporated, San Diego, CA (US)

(72) Inventors: Kanke Wu, San Diego, CA (US); Bin Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 438 days.

(21) Appl. No.: 17/821,695

(22) Filed: Aug. 23, 2022

(65) Prior Publication Data

US 2024/0072932 A1 Feb. 29, 2024

(51) Int. Cl.
*H04L 1/00* (2006.01)
*H03M 13/31* (2006.01)
*H04L 27/36* (2006.01)

(52) U.S. Cl.
CPC .......... *H04L 1/0061* (2013.01); *H03M 13/31* (2013.01); *H04L 27/36* (2013.01)

(58) Field of Classification Search
None
See application file for complete search history.

(56) References Cited

U.S. PATENT DOCUMENTS

| | | | | |
|---|---|---|---|---|
| 9,287,899 | B1* | 3/2016 | Mazahreh | H03M 13/2921 |
| 2007/0291868 | A1* | 12/2007 | Olesen | H04L 1/0041 |
| | | | | 375/267 |
| 2013/0208665 | A1* | 8/2013 | Baldemair | H04W 72/21 |
| | | | | 370/329 |
| 2014/0317476 | A1* | 10/2014 | Hwang | H04L 1/0041 |
| | | | | 714/776 |
| 2016/0087649 | A1* | 3/2016 | Limberg | H03M 13/356 |
| | | | | 714/776 |

(Continued)

OTHER PUBLICATIONS

Arslan S.S., et al., "Concatenated Block Codes for Unequal Error Protection of Embedded Bit Streams", IEEE Transactions on Image Processing, IEEE, USA, vol. 21, No. 3, Mar. 1, 2012, pp. 1111-1122, XP011420279, section II (particularly figure 2) and section III.B.

(Continued)

*Primary Examiner* — Xavier S Wong
(74) *Attorney, Agent, or Firm* — Kevin M. Donnelly; Avek IP, LLC

(57) ABSTRACT

This disclosure provides methods, devices, and systems for forward error correction encoding and modulation with reliability differentiation. In some examples, a transmitting wireless communication device may use a concatenated encoding technique to generate a set of encoded bits that conveys both information bits of a first priority and information bits of a second priority lower than the first priority. In other examples, the transmitting device may use a parallel encoding technique to generate a first set of encoded bits that conveys information bits of the first priority and a second set of encoded bits that conveys information bits of the second priority. According to aspects of the disclosure, the transmitting device can map encoded bits corresponding to information bits of the first priority to relatively higher reliability bit positions of a modulation constellation.

34 Claims, 17 Drawing Sheets

(56) References Cited

U.S. PATENT DOCUMENTS

2017/0288748 A1\* 10/2017 Lou .................. H04L 27/26025
2017/0331734 A1\* 11/2017 Cariou ................... H04L 45/74

OTHER PUBLICATIONS

International Search Report and Written Opinion—PCT/US2023/070700—ISA/EPO—Oct. 30, 2023.
Mhamdi M., et al., "Efficient Multiple Concatenated Codes With Turbo-Like Decoding for UEP Wireless Transmission of Scalable JPEG 2000 Images", IEEE Access, vol. 7, Jan. 15, 2019, pp. 6327-6336, XP011705635, section II, figures 1 and 2.
Mobin A., et al., "Cross-layer Unequal Error Protection Using 64-HQAM and RCPT Codes for Robust Image Communication", SN Applied Sciences, vol. 3, No. 1, Jan. 11, 2021, 12 pages, XP093092999, Sections 2 and 3.

\* cited by examiner

FORWARD ERROR CORRECTION ENCODING WITH RELIABILITY DIFFERENTIATION

TECHNICAL FIELD

This disclosure relates generally to wireless communication, and more specifically, to forward error correction encoding and modulation with reliability differentiation.

DESCRIPTION OF THE RELATED TECHNOLOGY

A wireless local area network (WLAN) may be formed by one or more wireless access points (APs) that provide a shared wireless communication medium for use by multiple client devices also referred to as wireless stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

A source wireless communication device (which can be an AP or STA in a WLAN, for instance), in conjunction with sending information bits to a destination wireless communication device, can use forward error correction encoding to deliver the information bits with some level of redundancy. Using a forward error correction encoding technique such as a low-density parity-check (LDPC) encoding, the source wireless communication device can generate a set of encoded bits from which the information bits can accurately be conveyed even in some cases in which some of the encoded bits are not accurately received by the destination wireless communication device. The source wireless communication device can convert the set of encoded bits into modulation symbols according to a modulation scheme, such as quadrature amplitude modulation (QAM), and can modulate the modulation symbols onto a carrier signal to obtain a modulated carrier signal for transmission over a wireless channel to the destination wireless communication device.

SUMMARY

The systems, methods and devices of this disclosure each have several innovative aspects, no single one of which is solely responsible for the desirable attributes disclosed herein.

One innovative aspect of the subject matter described in this disclosure can be implemented in a method for wireless communication. The method includes performing a first forward error correction encoding operation on a first set of information bits associated with a first priority to obtain a first set of encoded bits, and performing a second forward error correction encoding operation on a portion of the first set of encoded bits and a second set of information bits associated with a second priority that is lower than the first priority, to obtain a second set of encoded bits. The method further includes mapping the second set of encoded bits to a set of modulation symbols in such a way that the first set of information bits is mapped to relatively higher reliability bit positions of a modulation constellation, while the second set of information bits is mapped to relatively lower reliability bit positions of the modulation constellation. The method further includes modulating the set of modulation symbols onto a carrier signal and transmitting the modulated carrier signal over a wireless channel.

Another innovative aspect of the subject matter described in this disclosure can be implemented in a wireless communication device. The wireless communication device includes at least one processor and at least one memory that is communicatively coupled with the at least one processor and that stores processor-readable code that, when executed by the at least one processor, is configured to perform a first forward error correction encoding operation on a first set of information bits associated with a first priority to obtain a first set of encoded bits, and perform a second forward error correction encoding operation on a portion of the first set of encoded bits and a second set of information bits associated with a second priority that is lower than the first priority, to obtain a second set of encoded bits. The processor-readable code, when executed by the at least one processor, is configured to map the second set of encoded bits to a set of modulation symbols in such a way that the first set of information bits is mapped to relatively higher reliability bit positions of a modulation constellation, while the second set of information bits is mapped to relatively lower reliability bit positions of the modulation constellation. The processor-readable code, when executed by the at least one processor, is configured to modulate the set of modulation symbols onto a carrier signal and transmit the modulated carrier signal over a wireless channel.

In some examples, the methods and wireless communication devices may be configured to divide a plurality of information bits into the first set of information bits and the second set of information bits according to a bit prioritization parameter that indicates, with respect to each of the set of modulation symbols, a proportion of bit positions of the modulation constellation that constitute relatively higher reliability bit positions of the modulation constellation.

In some examples of the methods and wireless communication devices, the first forward error correction encoding operation and the second forward error correction encoding operation are low-density parity-check (LDPC) encoding operations.

In some examples of the methods and wireless communication devices, the first set of information bits includes bits of data associated with an application.

In some examples of the methods and wireless communication devices, the first set of information bits includes bits of a first field of a medium access control (MAC) protocol data unit (MPDU) and the second set of information bits includes bits of a second field of the MPDU.

In some examples of the methods and wireless communication devices, the first set of information bits includes bits of a first MPDU and the second set of information bits includes bits of a second MPDU.

In some examples of the methods and wireless communication devices, the first set of information bits includes bits of a field of a physical layer (PHY) protocol data unit (PPDU).

In some examples of the methods and wireless communication devices, the modulation constellation comprises a quadrature amplitude modulation (QAM) constellation.

BRIEF DESCRIPTION OF THE DRAWINGS

Details of one or more aspects of the subject matter described in this disclosure are set forth in the accompanying drawings and the description below. However, the accompanying drawings illustrate only some typical aspects of this disclosure and are therefore not to be considered limiting of its scope. Other features, aspects, and advantages will become apparent from the description, the drawings and the claims.

Like reference numbers and designations in the various drawings indicate like elements.

DETAILED DESCRIPTION

Figure 1:
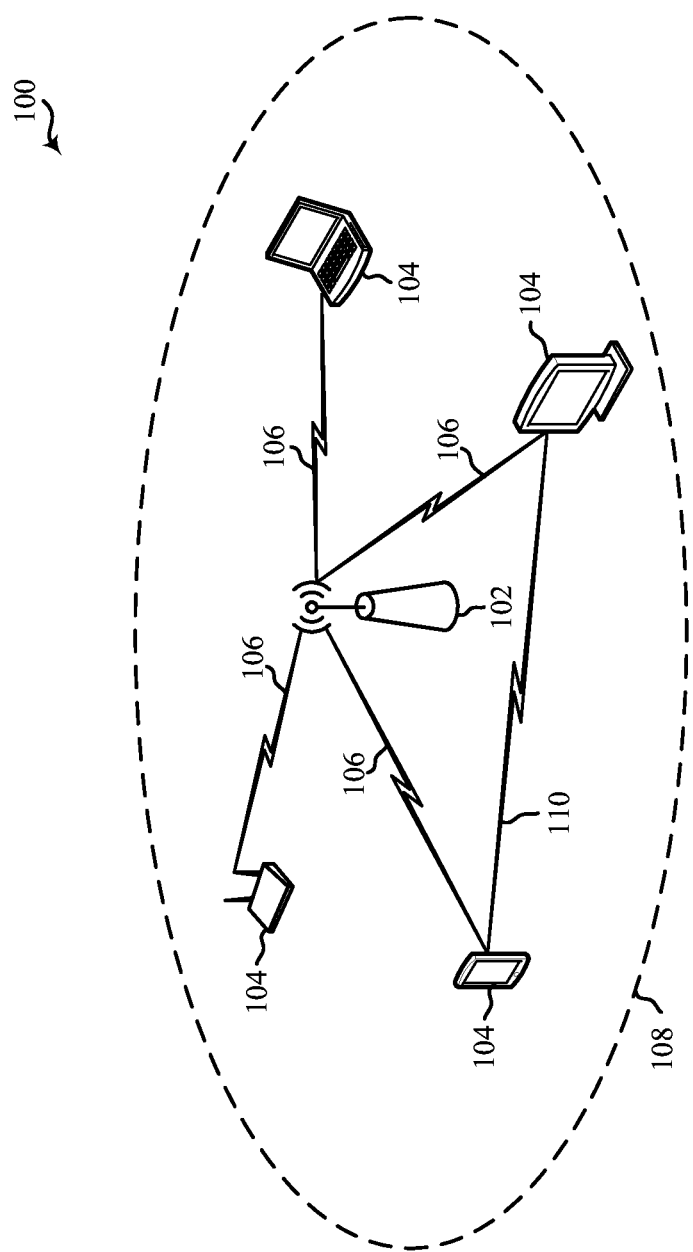
FIG. 1 shows a pictorial diagram of an example wireless communication network.

The following description is directed to some particular examples for the purposes of describing innovative aspects of this disclosure. However, a person having ordinary skill in the art will readily recognize that the teachings herein can be applied in a multitude of different ways. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3 rd Generation Partnership Project (3GPP), among others. The described examples can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO) and multi-user (MU)-MIMO. The described examples also can be implemented using other wireless communication protocols or RF signals suitable for use in one or more of a wireless personal area network (WPAN), a wireless local area network (WLAN), a wireless wide area network (WWAN), or an internet of things (IOT) network.

Various aspects relate generally to the use of relatively higher reliability bit positions of a modulation constellation to convey information of relatively greater importance or priority. Some aspects more specifically relate to performing forward error correction encoding of information bits, and mapping the resulting encoded bits to modulation symbols in such a way that encoded bits used to convey information bits associated with a first priority are mapped to constellation bit positions of relatively higher reliability, while encoded bits used to convey information bits associated with a second priority lower than the first priority are mapped to constellation bit positions of relatively lower reliability.

In some examples, a transmitting wireless communication device may use a concatenated encoding technique including multiple encoding stages to generate a set of encoded bits that conveys both information bits of the first priority and information bits of the second priority. In such examples, the transmitting device may parse information bits into a first set of information bits associated with a first priority and a second set of information bits associated with a second priority, and may perform a first forward error correction encoding operation on the first set of information bits that generates a first set of encoded bits. The transmitting device may then perform a second forward error correction encoding operation on the second set of information bits and at least a portion of the first set of encoded bits, to generate a second set of encoded bits. In such examples, the transmitting device may map portions of the second set of encoded bits that are associated with the first set of information bits to constellation bit positions of relatively higher reliability, and map portions of the second set of encoded bits that are associated with the second set of information bits to constellation bit positions of relatively lower reliability.

In other examples, the transmitting device may use a parallel encoding technique to generate two sets of encoded bits. In such examples, the transmitting device may parse information bits into a first set of information bits associated with a first priority and a second set of information bits associated with a second priority. The transmitting device may perform a first forward error correction encoding operation on the first set of information bits that generates a first set of encoded bits, and perform a second forward error correction encoding operation on the second set of information bits that generates a second set of encoded bits. In such examples, the transmitting device may map the first set of encoded bits to constellation bit positions of relatively higher reliability, and map the second set of encoded bits to constellation bit positions of relatively lower reliability.

In some examples, a receiving wireless communication device may extract, from a modulated wireless carrier signal, a set of received modulation symbols conveying information bits encoded according to the concatenated encoding technique discussed above. In such examples, the receiving device may demap bits from the set of received modulation symbols to obtain a set of received bits. The receiving device may then have the option to decode all of the set of received bits to obtain both the first set of information bits associated with the first priority and the second set of information bits associated with the second priority, or to decode only a portion of the set of received bits to obtain the first set of information bits associated with the first priority.

In other examples, the receiving device may extract, from a modulated wireless carrier signal, a set of received modulation symbols conveying information bits encoded according to the parallel encoding technique discussed above. In such examples, the receiving device may demap bits from the set of received modulation symbols to obtain a first set of received bits corresponding to the first set of encoded bits and a second set of received bits corresponding to the second set of encoded bits. The receiving device may then decode the first set of received bits to obtain the first set of information bits associated with the first priority, and decode the second set of received bits to obtain the second set of information bits associated with the second priority.

Particular aspects of the subject matter described in this disclosure can be implemented to realize one or more of the following potential advantages. In some examples, the described techniques can be used to leverage the higher reliabilities of certain bit positions of a modulation constellation to increase the rate of successful recovery, on the receive side, of information bits that are of greater importance or priority than others. A transmitting device can use the concatenated encoding technique to advantageously provide a receiving device with the flexibility to save processing resources by recovering only higher-priority information bits when desired. In contrast, the transmitting device can use the parallel encoding technique to advantageously convey information bits at a greater rate, relative to that supported by the concatenated encoding technique, by reducing the bit overhead associated with forward error correction encoding relative to that associated with forward error correction encoding in conjunction with the concatenated encoding technique.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2016 specification or amendments thereof including, but not limited to, 802.11ay, 802.11ax, 802.11az, 802.11ba and 802.11be). The WLAN 100 may include numerous wireless communication devices such as an access point (AP) 102 and multiple stations (STAs) 104. While only one AP 102 is shown, the WLAN network 100 also can include multiple APs 102.

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices ("remotes"), printers, kitchen or other household appliances, key fobs (for example, for passive keyless entry and start (PKES) systems), among other examples.

A single AP 102 and an associated set of STAs 104 may be referred to as a basic service set (BSS), which is managed by the respective AP 102. FIG. 1 additionally shows an example coverage area 106 of the AP 102, which may represent a basic service area (BSA) of the WLAN 100. The BSS may be identified to users by a service set identifier (SSID), as well as to other devices by a basic service set identifier (BSSID), which may be a medium access control (MAC) address of the AP 102. The AP 102 periodically broadcasts beacon frames ("beacons") including the BSSID to enable any STAs 104 within wireless range of the AP 102 to "associate" or re-associate with the AP 102 to establish a respective communication link 108 (hereinafter also referred to as a "Wi-Fi link"), or to maintain a communication link 108, with the AP 102. For example, the beacons can include an identification of a primary channel used by the respective AP 102 as well as a timing synchronization function for establishing or maintaining timing synchronization with the AP 102. The AP 102 may provide access to external networks to various STAs 104 in the WLAN via respective communication links 108.

To establish a communication link 108 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (μs)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a communication link 108 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such examples, while the STAs 104 may be capable of communicating with each other through the AP 102 using communication links 108, STAs 104 also can communicate directly with each other via direct wireless links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 108) according to the IEEE 802.11 family of wireless communication protocol standards (such as that defined by the IEEE 802.11-2016 specification or amendments thereof including, but not limited to, 802.11ay, 802.11ax, 802.11az, 802.11ba and 802.11be). These standards define the WLAN radio and baseband protocols for the PHY and medium access control (MAC) layers. The APs 102 and STAs 104 transmit and receive wireless communications (hereinafter also referred to as "Wi-Fi communications") to and from one another in the form of physical layer protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some examples of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple subbands or frequency channels. For example, PPDUs conforming to the IEEE 802.11n, 802.11ac, 802.11ax and 802.11be standard amendments may be transmitted over the 2.4, 5 GHz or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 or 320 MHz by bonding together multiple 20 MHz channels.

Each PPDU is a composite structure that includes a PHY preamble and a payload in the form of a PHY service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is based on the particular IEEE 802.11 protocol to be used to transmit the payload.

Figure 2A:
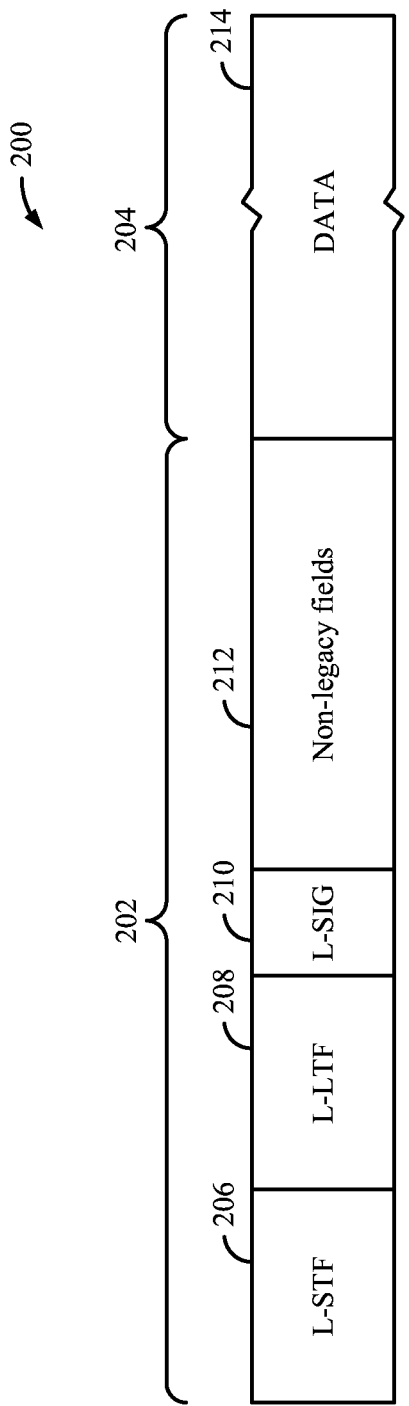
FIG. 2A shows an example protocol data unit (PDU) usable for communications between an access point (AP) and one or more stations (STAs).

FIG. 2A shows an example protocol data unit (PDU) 200 usable for wireless communication between an AP 102 and one or more STAs 104. For example, the PDU 200 can be configured as a PPDU. As shown, the PDU 200 includes a PHY preamble 202 and a PHY payload 204. For example, the preamble 202 may include a legacy portion that itself includes a legacy short training field (L-STF) 206, which may consist of two BPSK symbols, a legacy long training field (L-LTF) 208, which may consist of two BPSK symbols, and a legacy signal field (L-SIG) 210, which may consist of two BPSK symbols. The legacy portion of the preamble 202 may be configured according to the IEEE 802.11a wireless communication protocol standard. The preamble 202 may also include a non-legacy portion including one or more non-legacy fields 212, for example, conforming to an IEEE wireless communication protocol such as the IEEE 802.11ac, 802.11ax, 802.11be or later wireless communication protocol protocols.

The L-STF 206 generally enables a receiving device to perform coarse timing and frequency tracking and automatic gain control (AGC). The L-LTF 208 generally enables a receiving device to perform fine timing and frequency tracking and also to perform an initial estimate of the wireless channel. The L-SIG 210 generally enables a receiving device to determine a duration of the PDU and to use the determined duration to avoid transmitting on top of the PDU. For example, the L-STF 206, the L-LTF 208 and the L-SIG 210 may be modulated according to a binary phase shift keying (BPSK) modulation scheme. The payload 204 may be modulated according to a BPSK modulation scheme, a quadrature BPSK (Q-BPSK) modulation scheme, a quadrature amplitude modulation (QAM) modulation scheme, or another appropriate modulation scheme. The payload 204 may include a PSDU including a data field (DATA) 214 that, in turn, may carry higher layer data, for example, in the form of medium access control (MAC) protocol data units (MPDUs) or an aggregated MPDU (A-MPDU).

Figure 2B:
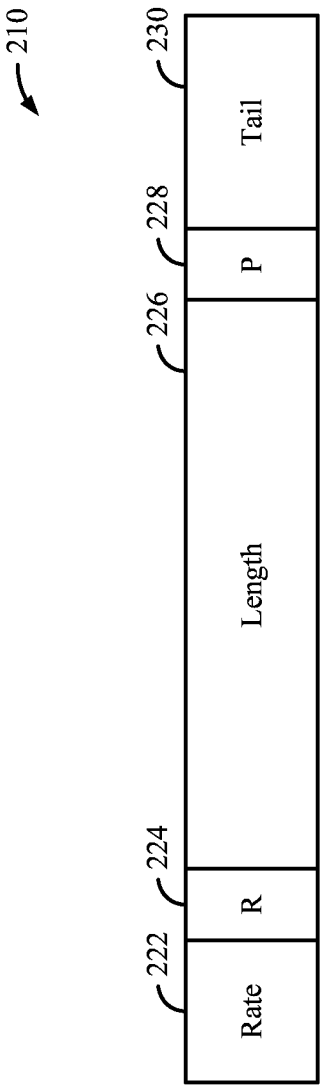
FIG. 2B shows an example field in the PDU of FIG. 2A.

FIG. 2B shows an example L-SIG 210 in the PDU 200 of FIG. 2A. The L-SIG 210 includes a data rate field 222, a reserved bit 224, a length field 226, a parity bit 228, and a tail field 230. The data rate field 222 indicates a data rate (note that the data rate indicated in the data rate field 212 may not be the actual data rate of the data carried in the payload 204). The length field 226 indicates a length of the packet in units of, for example, symbols or bytes. The parity bit 228 may be used to detect bit errors. The tail field 230 includes tail bits that may be used by the receiving device to terminate operation of a decoder (for example, a Viterbi decoder). The receiving device may utilize the data rate and the length indicated in the data rate field 222 and the length field 226 to determine a duration of the packet in units of, for example, microseconds (μs) or other time units.

Figure 3A:
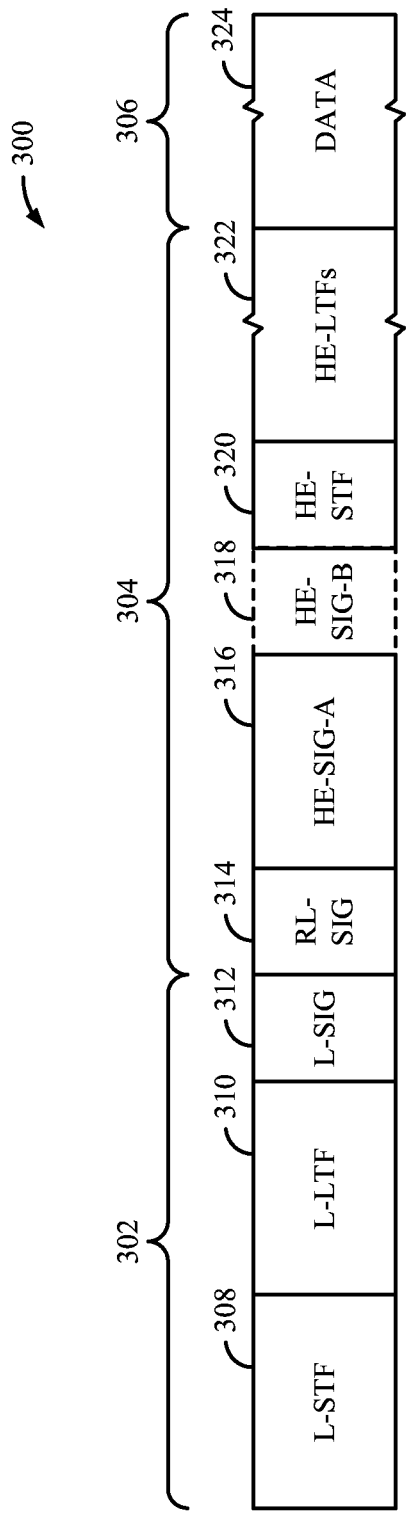
FIG. 3A shows an example physical layer protocol data unit (PPDU) usable for communications between an AP and one or more STAs.

FIG. 3A shows an example PPDU 300 usable for wireless communication between an AP and one or more STAs. The PPDU 300 may be used for SU, OFDMA or MU-MIMO transmissions. The PPDU 300 may be formatted as a High Efficiency (HE) WLAN PPDU in accordance with the IEEE 802.11ax amendment to the IEEE 802.11 wireless communication protocol standard. The PPDU 300 includes a PHY preamble including a legacy portion 302 and a non-legacy portion 304. The PPDU 300 may further include a PHY payload 306 after the preamble, for example, in the form of a PSDU including a data field 324.

The legacy portion 302 of the preamble includes an L-STF 308, an L-LTF 310, and an L-SIG 312. The non-legacy portion 304 includes a repetition of L-SIG (RL-SIG) 314, a first HE signal field (HE-SIG-A) 316, an HE short training field (HE-STF) 320, and one or more HE long training fields (or symbols) (HE-LTFs) 322. For OFDMA or MU-MIMO communications, the second portion 304 further includes a second HE signal field (HE-SIG-B) 318 encoded separately from HE-SIG-A 316. HE-STF 320 may be used for timing and frequency tracking and AGC, and HE-LTF 322 may be used for more refined channel estimation. Like the L-STF 308, L-LTF 310, and L-SIG 312, the information in RL-SIG 314 and HE-SIG-A 316 may be duplicated and transmitted in each of the component 20 MHz channels in instances involving the use of a bonded channel. In contrast, the content in HE-SIG-B 318 may be unique to each 20 MHz channel and target specific STAs 104.

RL-SIG 314 may indicate to HE-compatible STAs 104 that the PPDU 300 is an HE PPDU. An AP 102 may use HE-SIG-A 316 to identify and inform multiple STAs 104 that the AP has scheduled UL or DL resources for them. For example, HE-SIG-A 316 may include a resource allocation subfield that indicates resource allocations for the identified STAs 104. HE-SIG-A 316 may be decoded by each HE-compatible STA 104 served by the AP 102. For MU transmissions, HE-SIG-A 316 further includes information usable by each identified STA 104 to decode an associated HE-SIG-B 318. For example, HE-SIG-A 316 may indicate the frame format, including locations and lengths of HE-SIG-Bs 318, available channel bandwidths and modulation and coding schemes (MCSs), among other examples. HE-SIG-A 316 also may include HE WLAN signaling information usable by STAs 104 other than the identified STAs 104.

HE-SIG-B 318 may carry STA-specific scheduling information such as, for example, STA-specific (or "user-specific") MCS values and STA-specific RU allocation information. In the context of DL MU-OFDMA, such information enables the respective STAs 104 to identify and decode corresponding resource units (RUs) in the associated data field 324. Each HE-SIG-B 318 includes a common field and at least one STA-specific field. The common field can indicate RU allocations to multiple STAs 104 including RU assignments in the frequency domain, indicate which RUs are allocated for MU-MIMO transmissions and which RUs correspond to MU-OFDMA transmissions, and the number of users in allocations, among other examples. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields. Each user block field may include two user fields that contain information for two respective STAs to decode their respective RU payloads in data field 324.

Figure 3B:
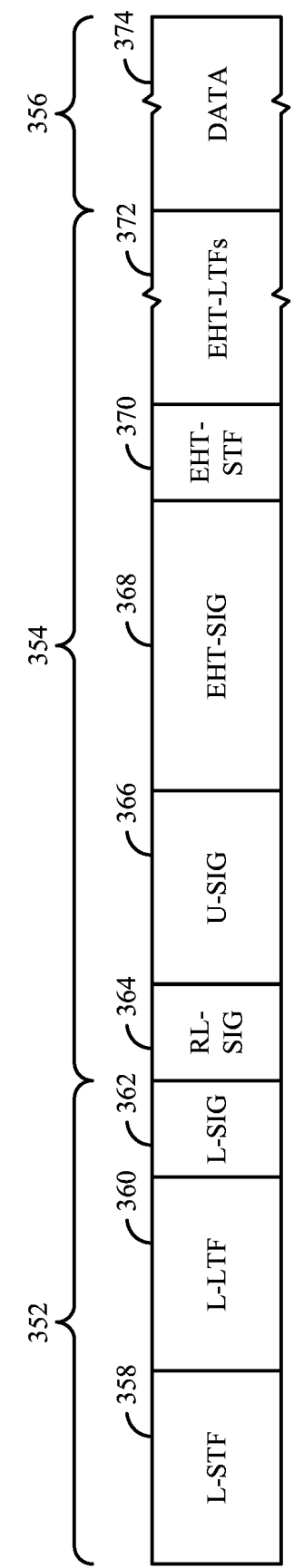
FIG. 3B shows another example PPDU usable for communications between an AP and one or more STAs.

FIG. 3B shows another example PPDU 350 usable for wireless communication between an AP and one or more STAs. The PPDU 350 may be used for SU, OFDMA or MU-MIMO transmissions. The PPDU 350 may be formatted as an Extreme High Throughput (EHT) WLAN PPDU in accordance with the IEEE 802.11be amendment to the IEEE 802.11 wireless communication protocol standard, or may be formatted as a PPDU conforming to any later (post-EHT) version of a new wireless communication protocol conforming to a future IEEE 802.11 wireless communication protocol standard or other wireless communication standard. The PPDU 350 includes a PHY preamble including a legacy portion 352 and a non-legacy portion 354. The PPDU 350 may further include a PHY payload 356 after the preamble, for example, in the form of a PSDU including a data field 374.

The legacy portion 352 of the preamble includes an L-STF 358, an L-LTF 360, and an L-SIG 362. The non-legacy portion 354 of the preamble includes an RL-SIG 364 and multiple wireless communication protocol version-dependent signal fields after RL-SIG 364. For example, the non-legacy portion 354 may include a universal signal field 366 (referred to herein as "U-SIG 366") and an EHT signal field 368 (referred to herein as "EHT-SIG 368"). One or both of U-SIG 366 and EHT-SIG 368 may be structured as, and carry version-dependent information for, other wireless communication protocol versions beyond EHT. The non-legacy portion 354 further includes an additional short training field 370 (referred to herein as "EHT-STF 370," although it may be structured as, and carry version-dependent information for, other wireless communication protocol versions beyond EHT) and one or more additional long training fields 372 (referred to herein as "EHT-LTFs 372," although they may be structured as, and carry version-dependent information for, other wireless communication protocol versions beyond EHT). EHT-STF 370 may be used for timing and frequency tracking and AGC, and EHT-LTF 372 may be used for more refined channel estimation. Like L-STF 358, L-LTF 360, and L-SIG 362, the information in U-SIG 366 and EHT-SIG 368 may be duplicated and transmitted in each of the component 20 MHz channels in instances involving the use of a bonded channel. In some examples, EHT-SIG 368 may additionally or alternatively carry information in one or more non-primary 20 MHz channels that is different than the information carried in the primary 20 MHz channel.

EHT-SIG 368 may include one or more jointly encoded symbols and may be encoded in a different block from the block in which U-SIG 366 is encoded. EHT-SIG 368 may be used by an AP to identify and inform multiple STAs 104 that the AP has scheduled UL or DL resources for them. EHT-SIG 368 may be decoded by each compatible STA 104 served by the AP 102. EHT-SIG 368 may generally be used by a receiving device to interpret bits in the data field 374. For example, EHT-SIG 368 may include RU allocation information, spatial stream configuration information, and per-user signaling information such as MCSs, among other examples. EHT-SIG 368 may further include a cyclic redundancy check (CRC) (for example, four bits) and a tail (for example, 6 bits) that may be used for binary convolutional code (BCC). In some examples, EHT-SIG 368 may include one or more code blocks that each include a CRC and a tail. In some aspects, each of the code blocks may be encoded separately.

EHT-SIG 368 may carry STA-specific scheduling information such as, for example, user-specific MCS values and user-specific RU allocation information. EHT-SIG 368 may generally be used by a receiving device to interpret bits in the data field 374. In the context of DL MU-OFDMA, such information enables the respective STAs 104 to identify and decode corresponding RUs in the associated data field 374. Each EHT-SIG 368 may include a common field and at least one user-specific field. The common field can indicate RU distributions to multiple STAs 104, indicate the RU assignments in the frequency domain, indicate which RUs are allocated for MU-MIMO transmissions and which RUs correspond to MU-OFDMA transmissions, and the number of users in allocations, among other examples. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields. Each user block field may include, for example, two user fields that contain information for two respective STAs to decode their respective RU payloads.

The presence of RL-SIG 364 and U-SIG 366 may indicate to EHT- or later version-compliant STAs 104 that the PPDU 350 is an EHT PPDU or a PPDU conforming to any later (post-EHT) version of a new wireless communication protocol conforming to a future IEEE 802.11 wireless communication protocol standard. For example, U-SIG 366 may be used by a receiving device to interpret bits in one or more of EHT-SIG 368 or the data field 374.

Figure 4:
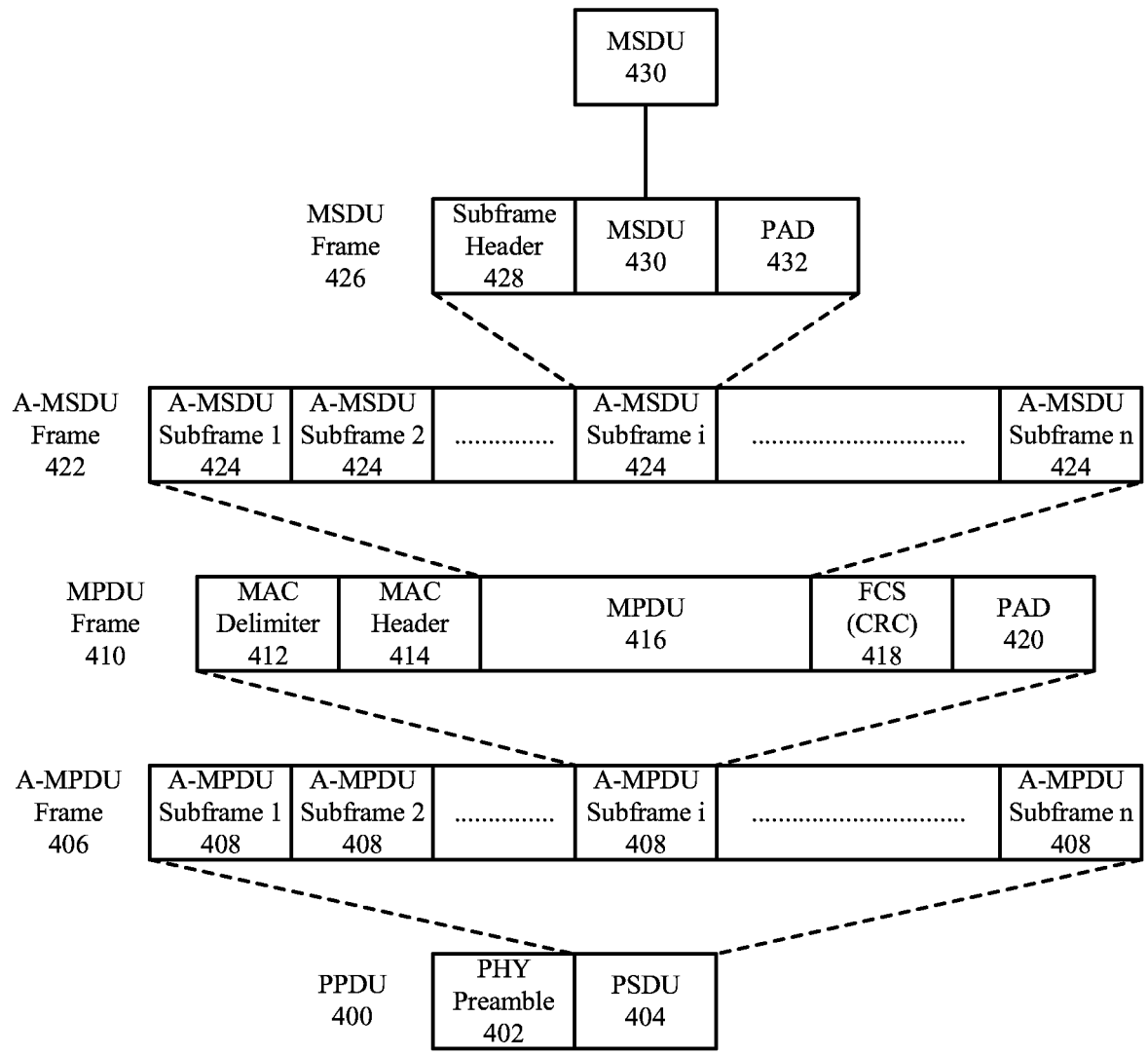
FIG. 4 shows an example PPDU usable for communications between an AP and one or more STAs.

FIG. 4 shows an example PPDU 400 usable for communications between an AP 102 and one or more STAs 104. As described above, each PPDU 400 includes a PHY preamble 402 and a PSDU 404. Each PSDU 404 may represent (or "carry") one or more MAC protocol data units (MPDUs) 416. For example, each PSDU 404 may carry an aggregated MPDU (A-MPDU) 406 that includes an aggregation of multiple A-MPDU subframes 408. Each A-MPDU subframe 406 may include an MPDU frame 410 that includes a MAC delimiter 412 and a MAC header 414 prior to the accompanying MPDU 416, which comprises the data portion ("payload" or "frame body") of the MPDU frame 410. Each MPDU frame 410 may also include a frame check sequence (FCS) field 418 for error detection (for example, the FCS field may include a cyclic redundancy check (CRC)) and padding bits 420. The MPDU 416 may carry one or more MAC service data units (MSDUs) 426. For example, the MPDU 416 may carry an aggregated MSDU (A-MSDU) 422 including multiple A-MSDU subframes 424. Each A-MSDU subframe 424 contains a corresponding MSDU 430 preceded by a subframe header 428 and in some cases followed by padding bits 432.

Referring back to the MPDU frame 410, the MAC delimiter 412 may serve as a marker of the start of the associated MPDU 416 and indicate the length of the associated MPDU 416. The MAC header 414 may include multiple fields containing information that defines or indicates characteristics or attributes of data encapsulated within the frame body 416. The MAC header 414 includes a duration field indicating a duration extending from the end of the PPDU until at least the end of an acknowledgment (ACK) or Block ACK (BA) of the PPDU that is to be transmitted by the receiving wireless communication device. The use of the duration field serves to reserve the wireless medium for the indicated duration, and enables the receiving device to establish its network allocation vector (NAV). The MAC header 414 also includes one or more fields indicating addresses for the data encapsulated within the frame body 416. For example, the MAC header 414 may include a combination of a source address, a transmitter address, a receiver address or a destination address. The MAC header 414 may further include a frame control field containing control information. The frame control field may specify a frame type, for example, a data frame, a control frame, or a management frame.

Figure 5:
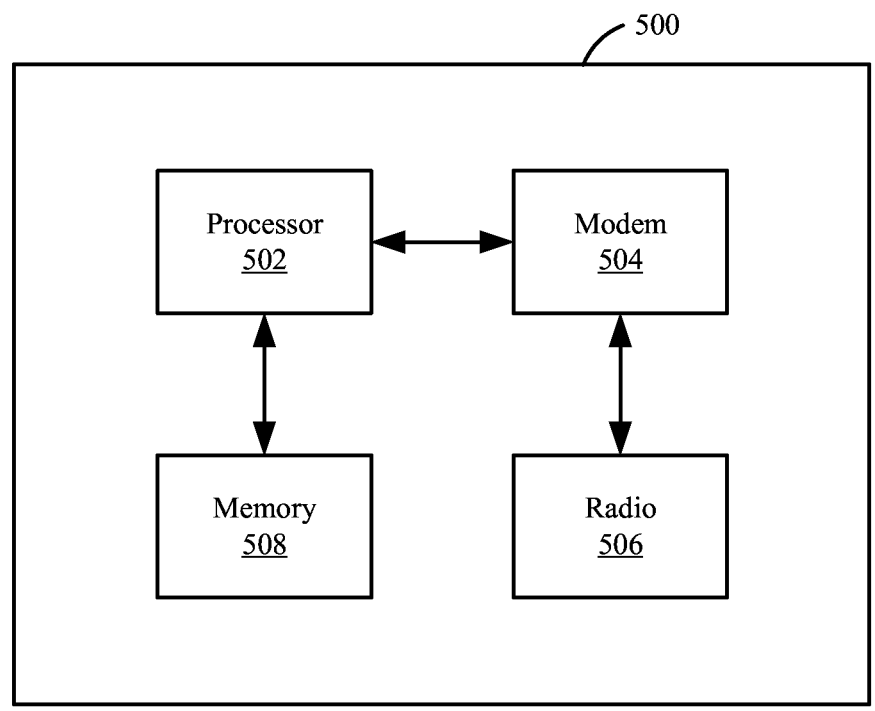
FIG. 5 shows a block diagram of an example wireless communication device.

FIG. 5 shows a block diagram of an example wireless communication device 500. In some examples, the wireless communication device 500 can be an example of a device for use in a STA such as one of the STAs 104 described above with reference to FIG. 1. In some examples, the wireless communication device 500 can be an example of a device for use in an AP such as the AP 102 described above with reference to FIG. 1. The wireless communication device 500 is capable of transmitting and receiving wireless communications in the form of, for example, wireless packets. For example, the wireless communication device can be configured to transmit and receive packets in the form of physical layer protocol data units (PPDUs) and medium access control (MAC) protocol data units (MPDUs) conforming to an IEEE 802.11 wireless communication protocol standard, such as that defined by the IEEE 802.11-2016 specification or amendments thereof including, but not limited to, 802.11ay, 802.11ax, 802.11az, 802.11ba and 802.11be.

The wireless communication device 500 can be, or can include, a chip, system on chip (SoC), chipset, package or device that includes one or more modems 502, for example, a Wi-Fi (IEEE 802.11 compliant) modem. In some examples, the one or more modems 502 (collectively "the modem 502") additionally include a WWAN modem (for example, a 3GPP 4G LTE or 5G compliant modem). In some examples, the wireless communication device 500 also includes one or more processors, processing blocks or processing elements 504 (collectively "the processor 504") coupled with the modem 502. In some examples, the wireless communication device 500 additionally includes one or more radios 506 (collectively "the radio 506") coupled with the modem 502. In some examples, the wireless communication device 500 further includes one or more memory blocks or elements 508 (collectively "the memory 508") coupled with the processor 504 or the modem 502.

The modem 502 can include an intelligent hardware block or device such as, for example, an application-specific integrated circuit (ASIC), among other examples. The modem 502 is generally configured to implement a PHY layer, and in some examples, also a portion of a MAC layer (for example, a hardware portion of the MAC layer). For example, the modem 502 is configured to modulate packets and to output the modulated packets to the radio 504 for transmission over the wireless medium. The modem 502 is similarly configured to obtain modulated packets received by the radio 504 and to demodulate the packets to provide demodulated packets. In addition to a modulator and a demodulator, the modem 502 may further include digital signal processing (DSP) circuitry, automatic gain control (AGC) circuitry, a coder, a decoder, a multiplexer and a demultiplexer. For example, while in a transmission mode, data obtained from the processor 506 may be provided to an encoder, which encodes the data to provide coded bits. The coded bits may then be mapped to a number $N_{SS}$ of spatial streams for spatial multiplexing or a number N STS of space-time streams for space-time block coding (STBC).

The coded bits in the streams may then be mapped to points in a modulation constellation (using a selected MCS) to provide modulated symbols. The modulated symbols in the respective spatial or space-time streams may be multiplexed, transformed via an inverse fast Fourier transform (IFFT) block, and subsequently provided to the DSP circuitry (for example, for Tx windowing and filtering). The digital signals may then be provided to a digital-to-analog converter (DAC). The resultant analog signals may then be provided to a frequency upconverter, and ultimately, the radio 504. In examples involving beamforming, the modulated symbols in the respective spatial streams are precoded via a steering matrix prior to their provision to the IFFT block.

While in a reception mode, the DSP circuitry is configured to acquire a signal including modulated symbols received from the radio 504, for example, by detecting the presence of the signal and estimating the initial timing and frequency offsets. The DSP circuitry is further configured to digitally condition the signal, for example, using channel (narrowband) filtering and analog impairment conditioning (such as correcting for I/Q imbalance), and by applying digital gain to ultimately obtain a narrowband signal. The output of the DSP circuitry may then be fed to the AGC, which is configured to use information extracted from the digital signals, for example, in one or more received training fields, to determine an appropriate gain. The output of the DSP circuitry also is coupled with a demultiplexer that demultiplexes the modulated symbols when multiple spatial streams or space-time streams are received. The demultiplexed symbols may be provided to a demodulator, which is configured to extract the symbols from the signal and, for example, compute the logarithm likelihood ratios (LLRs) for each bit position of each subcarrier in each spatial stream. The demodulator is coupled with the decoder, which may be configured to process the LLRs to provide decoded bits. The decoded bits may then be descrambled and provided to the MAC layer (the processor 506) for processing, evaluation or interpretation.

The radio 504 generally includes at least one radio frequency (RF) transmitter (or "transmitter chain") and at least one RF receiver (or "receiver chain"), which may be combined into one or more transceivers. For example, each of the RF transmitters and receivers may include various analog circuitry including at least one power amplifier (PA) and at least one low-noise amplifier (LNA), respectively. The RF transmitters and receivers may, in turn, be coupled to one or more antennas. For example, in some examples, the wireless communication device 500 can include, or be coupled with, multiple transmit antennas (each with a corresponding transmit chain) and multiple receive antennas (each with a corresponding receive chain). The symbols output from the modem 502 are provided to the radio 504, which then transmits the symbols via the coupled antennas. Similarly, symbols received via the antennas are obtained by the radio 504, which then provides the symbols to the modem 502.

The processor 506 can include an intelligent hardware block or device such as, for example, a processing core, a processing block, a central processing unit (CPU), a microprocessor, a microcontroller, a digital signal processor (DSP), an application-specific integrated circuit (ASIC), a programmable logic device (PLD) such as a field programmable gate array (FPGA), discrete gate or transistor logic, discrete hardware components, or any combination thereof designed to perform the functions described herein. The processor 506 processes information received through the radio 504 and the modem 502, and processes information to be output through the modem 502 and the radio 504 for transmission through the wireless medium. For example, the processor 506 may implement a control plane and at least a portion of a MAC layer configured to perform various operations related to the generation, transmission, reception and processing of MPDUs, frames or packets. In some examples, the MAC layer is configured to generate MPDUs for provision to the PHY layer for coding, and to receive decoded information bits from the PHY layer for processing as MPDUs. The MAC layer may further be configured to allocate time and frequency resources, for example, for OFDMA, among other operations or techniques. In some examples, the processor 506 may generally control the modem 502 to cause the modem to perform various operations described above.

The memory 504 can include tangible storage media such as random-access memory (RAM) or read-only memory (ROM), or combinations thereof. The memory 504 also can store non-transitory processor- or computer-executable software (SW) code containing instructions that, when executed by the processor 506, cause the processor to perform various operations described herein for wireless communication, including the generation, transmission, reception and interpretation of MPDUs, frames or packets. For example, various functions of components disclosed herein, or various blocks or steps of a method, operation, process or algorithm disclosed herein, can be implemented as one or more modules of one or more computer programs.

Figure 6B:
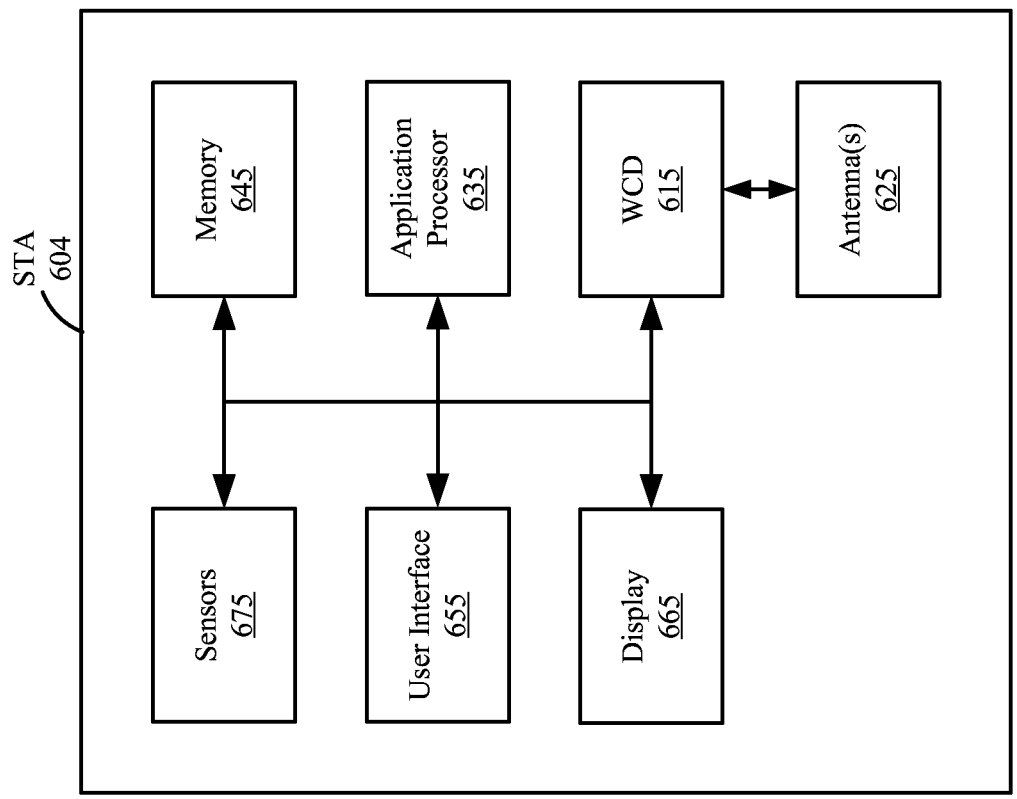
FIG. 6B shows a block diagram of an example station (STA).
Figure 6A:
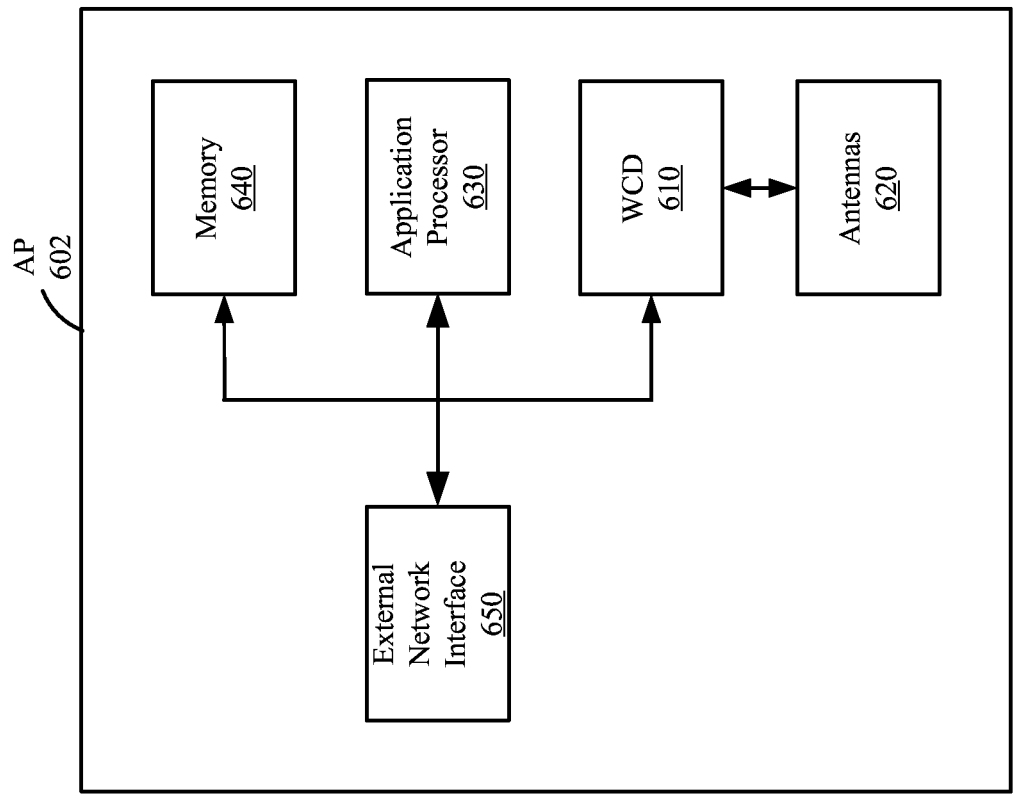
FIG. 6A shows a block diagram of an example access point (AP).

FIG. 6A shows a block diagram of an example AP 602. For example, the AP 602 can be an example of the AP 102 described with reference to FIG. 1. The AP 602 includes a wireless communication device (WCD) 610 (although the AP 602 may itself also be referred to generally as a wireless communication device as used herein). For example, the wireless communication device 610 may be an example of the wireless communication device 500 described with reference to FIG. 5. The AP 602 also includes multiple antennas 620 coupled with the wireless communication device 610 to transmit and receive wireless communications. In some examples, the AP 602 additionally includes an application processor 630 coupled with the wireless communication device 610, and a memory 640 coupled with the application processor 630. The AP 602 further includes at least one external network interface 650 that enables the AP 602 to communicate with a core network or backhaul network to gain access to external networks including the Internet. For example, the external network interface 650 may include one or both of a wired (for example, Ethernet) network interface and a wireless network interface (such as a WWAN interface). Ones of the aforementioned components can communicate with other ones of the components directly or indirectly, over at least one bus. The AP 602 further includes a housing that encompasses the wireless communication device 610, the application processor 630, the memory 640, and at least portions of the antennas 620 and external network interface 650.

FIG. 6B shows a block diagram of an example STA 604. For example, the STA 604 can be an example of the STA 104 described with reference to FIG. 1. The STA 604 includes a wireless communication device 615 (although the STA 604 may itself also be referred to generally as a wireless communication device as used herein). For example, the wireless communication device 615 may be an example of the wireless communication device 500 described with reference to FIG. 5. The STA 604 also includes one or more antennas 625 coupled with the wireless communication device 615 to transmit and receive wireless communications. The STA 604 additionally includes an application processor 635 coupled with the wireless communication device 615, and a memory 645 coupled with the application processor 635. In some examples, the STA 604 further includes a user interface (UI) 655 (such as a touchscreen or keypad) and a display 665, which may be integrated with the UI 655 to form a touchscreen display. In some examples, the STA 604 may further include one or more sensors 675 such as, for example, one or more inertial sensors, accelerometers, temperature sensors, pressure sensors, or altitude sensors. Ones of the aforementioned components can communicate with other ones of the components directly or indirectly, over at least one bus. The STA 604 further includes a housing that encompasses the wireless communication device 615, the application processor 635, the memory 645, and at least portions of the antennas 625, UI 655, and display 665.

Various aspects relate generally to the use of relatively higher reliability bit positions of a modulation constellation to convey information of relatively greater importance or priority. Some aspects more specifically relate to performing forward error correction encoding of information bits, and mapping the resulting encoded bits to modulation symbols in such a way that encoded bits used to convey information bits associated with a first priority are mapped to constellation bit positions of relatively higher reliability, while encoded bits used to convey information bits associated with a second priority lower than the first priority are mapped to constellation bit positions of relatively lower reliability.

In some examples, a transmitting wireless communication device may use a concatenated encoding technique including multiple encoding stages to generate a set of encoded bits that conveys both information bits of the first priority and information bits of the second priority. In such examples, the transmitting device may parse information bits into a first set of information bits associated with a first priority and a second set of information bits associated with a second priority, and may perform a first forward error correction encoding operation on the first set of information bits that generates a first set of encoded bits. The transmitting device may then perform a second forward error correction encoding operation on the second set of information bits and at least a portion of the first set of encoded bits, to generate a second set of encoded bits. In such examples, the transmitting device may map portions of the second set of encoded bits that are associated with the first set of information bits to constellation bit positions of relatively higher reliability, and map portions of the second set of encoded bits that are associated with the second set of information bits to constellation bit positions of relatively lower reliability.

In some other examples, the transmitting device may use a parallel encoding technique to generate two sets of encoded bits. In such examples, the transmitting device may parse information bits into a first set of information bits associated with a first priority and a second set of information bits associated with a second priority. The transmitting device may perform a first forward error correction encoding operation on the first set of information bits that generates a first set of encoded bits, and perform a second forward error correction encoding operation on the second set of information bits that generates a second set of encoded bits. In such examples, the transmitting device may map the first set of encoded bits to constellation bit positions of relatively higher reliability, and map the second set of encoded bits to constellation bit positions of relatively lower reliability.

In some examples, a receiving wireless communication device may extract, from a modulated wireless carrier signal, a set of received modulation symbols conveying information bits encoded according to the concatenated encoding technique discussed above. In such examples, the receiving device may demap bits from the set of received modulation symbols to obtain a set of received bits. The receiving device may then have the option to decode all of the set of received bits to obtain both the first set of information bits associated with the first priority and the second set of information bits associated with the second priority, or to decode only a portion of the set of received bits to obtain the first set of information bits associated with the first priority.

In other examples, the receiving device may extract, from a modulated wireless carrier signal, a set of received modulation symbols conveying information bits encoded according to the parallel encoding technique discussed above. In such examples, the receiving device may demap bits from the set of received modulation symbols to obtain a first set of received bits corresponding to the first set of encoded bits and a second set of received bits corresponding to the second set of encoded bits. The receiving device may then decode the first set of received bits to obtain the first set of information bits associated with the first priority, and decode the second set of received bits to obtain the second set of information bits associated with the second priority.

Particular aspects of the subject matter described in this disclosure can be implemented to realize one or more of the following potential advantages. In some examples, the described techniques can be used to leverage the higher reliabilities of certain bit positions of a modulation constellation to increase the rate of successful recovery, on the receive side, of information bits that are of greater importance or priority than others. Use of the concatenated encoding technique can advantageously provide the receiving device with the flexibility to save processing resources by recovering only higher-priority information bits when desired. Use of the parallel encoding technique can advantageously enable a source device to convey information bits at a greater rate relative to that supported by the concatenated encoding technique, by reducing the bit overhead associated with forward error correction encoding relative to that associated with forward error correction encoding in conjunction with the concatenated encoding technique.

Figure 7:
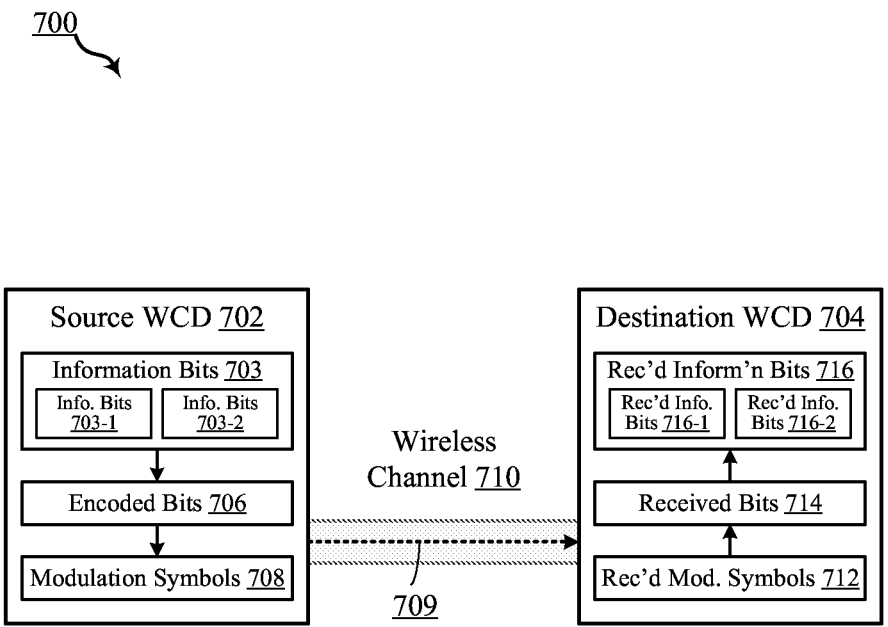
FIG. 7 shows a block diagram of an example operating environment.

FIG. 7 shows a block diagram of an example operating environment 700 in which forward error correction encoding and modulation with reliability differentiation can be implemented according to aspects of the disclosure. In operating environment 700, a source wireless communication device (WCD) 702 can communicate with a destination WCD 704 via a wireless channel 710. In some examples, wireless channel 710 can be a wireless channel of a wireless communication network, such as WLAN 100 of FIG. 1. In some examples, source WCD 702 can be an AP in a WLAN (for example, AP 102 in WLAN 100), and destination WCD 704 can be a STA in the WLAN (for example, a STA 104 in WLAN 100), or vice versa. In some examples, source WCD 702 and destination WCD 704 can be two respective STAs in a WLAN (for example, two respective STAs 104 in WLAN 100). In some examples, wireless channel 710 can be a wireless channel of another type of wireless network (for example, a cellular radio access network (RAN), wireless personal area network (WPAN), or other type of wireless network), and source WCD 702 and destination WCD 704 can wirelessly communicate in that network. In some examples, wireless channel 710 can represent a direct wireless link between source WCD 702 and destination WCD 704 that is not associated with any particular wireless network.

In operating environment 700, source WCD 702 sends information bits 703 to destination WCD 704. Information bits 703 can include application layer data, such as bits of data associated with one or more applications. Information bits 703 can additionally or alternatively include bits that convey lower-layer information, such as MAC-layer information, PHY-layer information, or combinations thereof. For instance, information bits 703 can include bits of one or more fields of one or more MPDUs (for example, MPDU(s) 416 of FIG. 4), bits of one or more fields of one or more PPDUs (for example, PPDU(s) 300 of FIG. 3A or PPDU(s) 350 of FIG. 3B), or combinations thereof. It is worthy of note that although source WCD 702 and destination WCD 704 act as the source and destination, respectively, of the information bits 703 conveyed over wireless channel 710 in operating environment 700, each may be capable of serving in the reverse role. For instance, in some examples, destination WCD 704 may send information bits (not pictured) to source WCD 702 via wireless channel 710.

Source WCD 702 can apply a forward error correction encoding technique to generate encoded bits 706 based on information bits 703. In some examples, source WCD 702 can generate encoded bits 706 by encoding information bits 703 using low-density parity-check (LDPC) encoding. In some other examples, source WCD 702 can generate encoded bits 706 by encoding information bits 703 using another forward error correction encoding technique, such as binary convolutional code (BCC) encoding or linear block code encoding.

Source WCD 702 can generate modulation symbols 708 based on encoded bits 706 according to a modulation scheme. In some examples, the modulation scheme can be a quadrature amplitude modulation (QAM) modulation scheme, such as 16-QAM, 64-QAM, 256-QAM, 1024-QAM, or 4096-QAM. In some examples, another type of modulation scheme can be used, such as a phase-shift keying (PSK), frequency-shift keying (FSK), or amplitude-shift keying (ASK) modulation scheme. In conjunction with generating modulation symbols 708, source WCD 702 can map bits among encoded bits 706 to bit positions of a modulation constellation associated with the modulation scheme being used. The number of encoded bits 706 mapped to each modulation symbol 708 can depend on the modulation scheme. For example, source WCD 702 can map ten respective encoded bits 706 to each modulation symbol 708 if it is implementing 1024-QAM modulation, but can map twelve respective encoded bits 706 to each modulation symbol 708 if it is implementing 4096-QAM.

Source WCD 702 can generate a modulated carrier signal 709 by modulating modulation symbols 708 onto a carrier signal, and can transmit the modulated carrier signal 709 over wireless channel 710 to destination WCD 704. Destination WCD 704 can receive and process the modulated carrier signal 709 to extract received modulation symbols 712 according to the modulation scheme, convert received modulation symbols 712 to received bits 714 by de-mapping bits from received modulation symbols 712, and obtain received information bits 716 by decoding received bits 714.

Ideally, received modulation symbols 712 will exactly match the modulation symbols 708 modulated onto the carrier signal to generate modulated carrier signal 709, and received bits 714 will exactly match the encoded bits 706 that were converted into those modulation symbols 708. However, under real-world conditions, due to factors such as signal attenuation, interference, and multipath propagation, the received modulation symbols 712 that destination WCD 704 extracts from modulated carrier signal 709 may often differ from the modulation symbols 708 modulated onto the carrier signal to at least some extent. When received modulation symbols 712 differ from modulation symbols 708, the received bits 714 obtained at destination WCD 704 will differ from the encoded bits 706 that were converted into modulation symbols 708 at source WCD 702. Due to redundancy provided by forward error correction encoding, however, the received information bits 716 ultimately obtained at destination WCD 704 may match the information bits 703 sent by source WCD 702 even when received bits 714 differ from encoded bits 706.

In some examples, the respective reliabilities of various bit positions of the modulation constellation in use in operating environment 700 can differ. According to aspects of the disclosure, source WCD 702 can differentiate between bit positions of the modulation constellation based on their reliabilities in conjunction with mapping encoded bits 706 to modulation symbols 708. In some examples, source WCD 702 can recognize multiple priority levels with respect to the information bits 703 to be conveyed to destination WCD 704 and the bit positions of the modulation constellation. In some examples, source WCD 702 can parse information bits 703 into multiple sets of information bits 703, each to be conveyed via bit positions associated with its respective priority level.

In some examples, source WCD 702 can parse information bits 703 into a first set of information bits 703-1 associated with a first priority and a second set of information bits 703-2 associated with a second priority lower than the first priority. In some examples, source WCD 702 can map encoded bits 706 that convey bits among those in the first set of information bits 703-1 to relatively higher reliability bit positions, and can map encoded bits 706 that convey bits among those in the second set of information bits 703-2 to relatively lower reliability bit positions.

In some examples, source WCD 702 can parse information bits 703 into the first and second sets of information bits 703-1 and 703-2 according to a bit prioritization parameter. The bit prioritization parameter can indicate, with respect to each modulation symbol 708, a proportion of bit positions of the modulation constellation that are to convey information bits 703 of the first priority. In some examples, based on the bit prioritization parameter, source WCD 702 can identify the bit positions of the modulation constellation that should, in each modulation symbol 708, convey bits among those in the first set of information bits 703-1, and the bits positions that should convey bits among those in the second set of information bits 703-2.

For instance, in an example, source WCD 702 can implement 1024-QAM modulation, such that each modulation symbol 708 conveys ten encoded bits 706. According to a bit prioritization parameter, source WCD 702 can determine that two relatively higher reliability bit positions of the modulation constellation are to convey information bits 703-1 of a first priority, while the remaining eight bit positions of the modulation constellation are to convey information bits 703-2 of a second, lower priority. Source WCD 702 can identify two most reliable bit positions of the 1024-QAM constellation as the two relatively higher reliability bit positions, and can map encoded bits 706 conveying information bits 703-1 of the first priority to those two bit positions in each of modulation symbols 708. Source WCD 702 can map encoded bits 706 conveying information bits 703-2 of the second, lower priority to the eight remaining bit positions in each of modulation symbols 708.

According to aspects of the disclosure, source WCD 702 can parse information bits 703 into the first and second sets of information bits 703-1 and 703-2 according to a ratio between the respective numbers of relatively higher reliability bit positions and relatively lower reliability bit positions in each modulation symbol 708, as indicated or implied by the bit prioritization parameter. For instance, in the above example in which the bit prioritization parameter indicates that two bit positions of the 1024-QAM modulation constellation are to convey information bits 703-1 of the first priority, the bit prioritization parameter implies a 4-to-1 ratio between bits of the second priority and bits of the first priority. Based on this implied ratio, in conjunction with parsing information bits 703, source WCD 702 can maintain a 4-to-1 ratio between the number of information bits 703-2 to which it assigns the second priority and the number of information bits 703-1 to which it assigns the first priority.

In some examples, destination WCD 704 can determine (for example, based on the bit prioritization parameter) which bit positions of in each of received modulation symbols 712 contain received bits 714 used to convey information bits of the first priority, and which contain received bits 714 used to convey information bits of the second priority that is lower than the first priority. In some examples, destination WCD 704 can decode received bits 714 of relatively higher reliability bit positions of the modulation constellation to obtain a first set of received information bits 716-1 that is associated with the first priority, and can decode received bits 714 of relatively lower reliability bit positions of the modulation constellation to obtain a second set of received information bits 716-2 that is associated with the second priority.

In some examples, having parsed information bits 703 into first and second sets of information bits 703-1 and 703-2 of the first and second respective priorities, source WCD 702 can employ a parallel encoding technique. According to the parallel encoding technique, source WCD 702 can perform separate respective forward error correction encodings of the first and second sets of information bits 703-1 and 703-2 in parallel to obtain first and second respective sets of encoded bits 706. Source WCD 702 then can map bits of the first set of encoded bits 706 to higher reliability bit positions of the modulation constellation, and can map bits of the second set of encoded bits 706 to lower reliability bits positions of the modulation constellation.

In some examples, rather than performing separate respective forward error correction encodings in parallel, source WCD 702 can employ a concatenated encoding technique. According to the concatenated encoding technique, source WCD 702 can first perform forward error correction encoding of the first set of information bits 703-1 to obtain a first set of encoded bits 706 that conveys the first set of information bits 703-1. Source WCD 702 can then combine the first set of encoded bits 706 (or a portion of the first set of encoded bits 706) with the second set of information bits 703-2, and perform forward error correction encoding of the combination of the two to obtain a second set of encoded bits 706 that conveys both the first set of information bits 703-1 and the second set of information bits 703-2.

Figure 8:
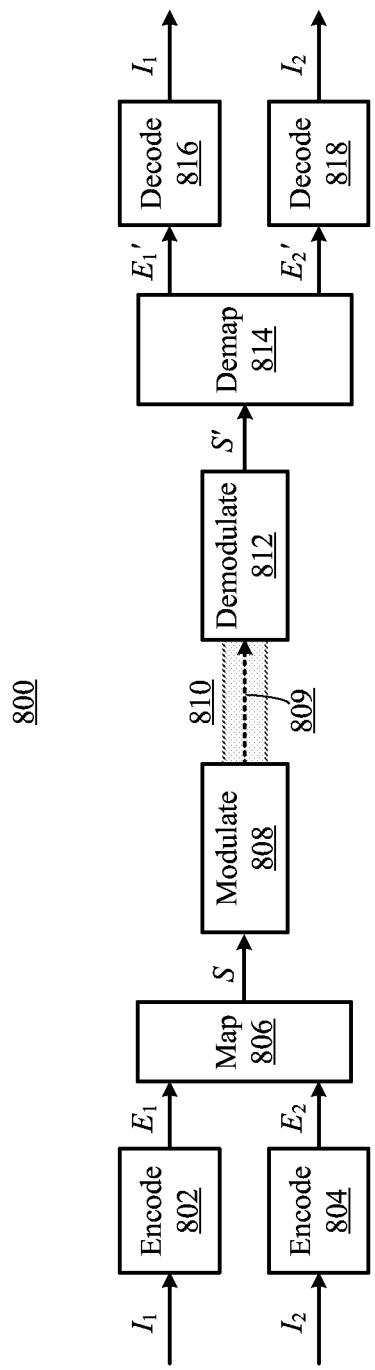
FIG. 8 shows a block diagram of an example communication process.

FIG. 8 shows a block diagram of an example communication process 800 according to some examples. According to aspects of the disclosure, source WCD 702 of FIG. 7 may perform operations of communication process 800 in conjunction with implementing a parallel encoding technique in operating environment 700.

According to communication process 800, a first set of information bits $I_1$ can be encoded at block 802, and a second set of information bits $I_2$ can be encoded in parallel at block 804. The set of information bits $I_1$ can be a set of information bits associated with a first priority, and the set of information bits $I_2$ can be a set of information bits associated with a second priority that is lower than the first priority. According to some examples, the sets of information bits $I_1$ and $I_2$ can be obtained by parsing a set of information bits into the sets of information bits $I_1$ and $I_2$ in accordance with a bit prioritization parameter. The sets of information bits $I_1$ and $I_2$ can be encoded at respective blocks 802 and 804 using forward error correction encoding, such as LDPC encoding, BCC encoding, or linear block code encoding.

Respective sets of encoded bits $E_1$ and $E_2$ can be obtained via the encoding of the sets of information bits $I_1$ and $I_2$ at blocks 802 and 804. The sets of encoded bits $E_1$ and $E_2$ can be mapped to bit positions of a modulation constellation at block 806 to convert the sets of encoded bits $E_1$ and $E_2$ to a set of modulation symbols S. According to some examples, the modulation constellation can be a QAM constellation, such as a 16-QAM, 64-QAM, 256-QAM, 1024-QAM, or 4096-QAM constellation. Bits of the set of encoded bits $E_1$ can be mapped to relatively higher reliability bit positions of the modulation constellation, and bits of the set of encoded bits $E_2$ can be mapped to relatively lower reliability bit positions of the modulation constellation.

The set of modulation symbols S can be modulated onto a carrier signal at block 808 to create a modulated carrier signal 809, which can be transmitted over a wireless channel 810 by a source device. A destination device that receives the modulated carrier signal 809 over the wireless channel 810 can extract a set of received modulation symbols S' from the modulated carrier signal 809 via demodulation performed at block 812.

Demapping can be performed at block 814 to obtain sets of received bits $E_1'$ and $E_2'$ based on the set of received modulation symbols S' extracted from the modulated carrier signal 809. The set of received bits $E_1'$ can be decoded at block 816 to obtain a set of received information bits $I_1'$, and a set of received bits $E_2'$ can be decoded at block 818 to obtain a set of received information bits $I_2'$.

Figure 9:
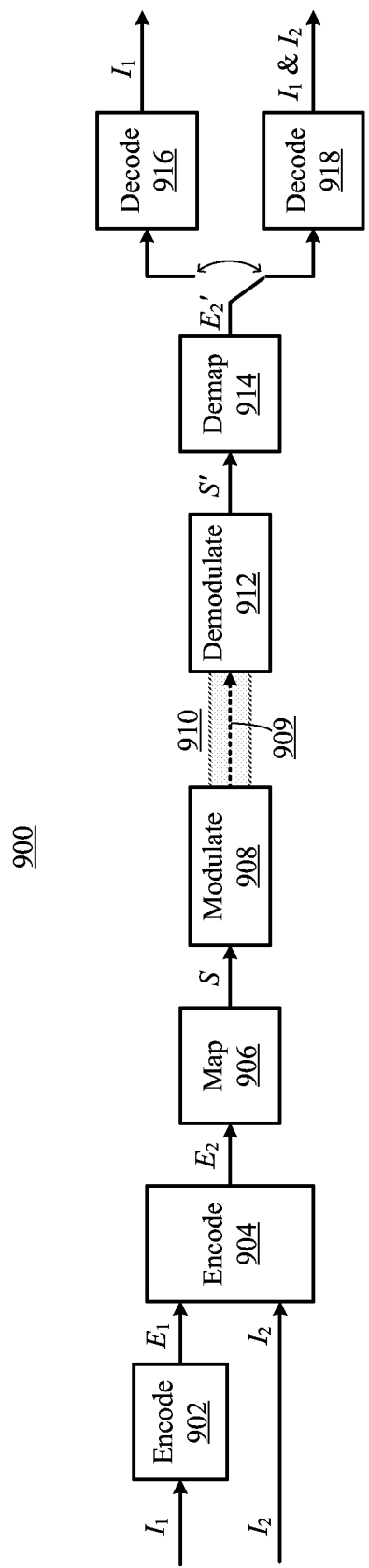
FIG. 9 shows a block diagram of an example communication process.

FIG. 9 shows a block diagram of an example communication process 900 according to some examples. According to aspects of the disclosure, source WCD 702 of FIG. 7 may perform operations of communication process 900 in conjunction with implementing a concatenated encoding technique in operating environment 700.

According to communication process 900, a first set of encoded bits $E_1$ can be obtained by encoding a first set of information bits $I_1$ at block 902. A combined encoding of the first set of encoded bits $E_1$ and a second set of information bits $I_2$ can then be performed at block 904 to obtain a second set of encoded bits $E_2$ that conveys both the first set of information bits $I_1$ and the second set of information bits $I_2$. The set of information bits $I_1$ can be a set of information bits associated with a first priority, and the set of information bits $I_2$ can be a set of information bits associated with a second priority that is lower than the first priority. According to some examples, the sets of information bits $I_1$ and $I_2$ can be obtained by parsing a set of information bits into the sets of information bits $I_1$ and $I_2$ in accordance with a bit prioritization parameter. The sets of encoded bits $E_1$ and $E_2$ can be obtained at respective blocks 902 and 904 using forward error correction encoding, such as LDPC encoding, BCC encoding, or linear block code encoding.

According to some examples, the second set of encoded bits $E_2$ can be obtained at block 904 by performing a combined encoding of a portion of (as opposed to all of) the first set of encoded bits $E_1$ and the second set of information bits $I_2$. For example, according to some examples, encoding the first set of information bits $I_1$ at block 902 can yield a first set of encoded bits $E_1$ that includes the first set of information bits $I_1$ and a first set of parity bits. According to aspects of the disclosure, the second set of encoded bits $E_2$ can be obtained at block 904 by performing a combined encoding of the second set of information bits $I_2$ and a portion of the first set of encoded bits $E_1$ that includes the first set of information bits $I_1$, and a portion of the first set of encoded bits $E_1$ that includes the first set of parity bits can be omitted from the combined encoding. The second set of encoded bits $E_2$ can include a second set of parity bits that is usable for forward error correction with respect to both the first set of information bits $I_1$ and the second set of information bits $I_2$.

The various bits of the set of encoded bits $E_2$ can be mapped to bit positions of a modulation constellation at block 906 to convert the set of encoded bits $E_2$ to a set of modulation symbols S. According to some examples, the modulation constellation can be a QAM constellation, such as a 16-QAM, 64-QAM, 256-QAM, 1024-QAM, or 4096-QAM constellation. Among the set of encoded bits $E_2$, encoded bits conveying information bits associated with the first priority (information bits among those in the first set of information bits $I_1$) can be mapped to relatively higher reliability bit positions of the modulation constellation, and encoded bits conveying information bits associated with the second priority (information bits among those in the second set of information bits $I_2$) can be mapped to relatively lower reliability bit positions of the modulation constellation.

According to aspects of the disclosure, in examples in which the portion of the first set of encoded bits $E_1$ that includes the first set of parity bits is omitted from the combined encoding that produces the second set of encoded bits $E_2$, the portion of the first set of encoded bits $E_1$ that includes the first set of parity bits can still be provided to the destination device in modulated carrier signal 909. In some examples, the mapping at block 906 can include converting the portion of the first set of encoded bits $E_1$ that includes the first set of parity bits to modulation symbols S, and can involve mapping the portion of the first set of encoded bits $E_1$ that includes the first set of parity bits to relatively higher reliability positions of the modulation constellation.

The set of modulation symbols S can be modulated onto a carrier signal at block 908 to create a modulated carrier signal 909, which can be transmitted over a wireless channel 910 by a source device. A destination device that receives the modulated carrier signal 909 over the wireless channel 910 can extract a set of received modulation symbols S' from the modulated carrier signal 909 via demodulation performed at block 912.

Demapping can be performed at block 914 to obtain a set of received bits $E_2'$ based on the set of received modulation symbols S' extracted from the modulated carrier signal 909. In examples in which the portion of the first set of encoded bits $E_1$ that includes the first set of parity bits is omitted from the combined encoding at block 904 but included in the mapping at block 906, the demapping at block 914 can include obtaining an additional set of received bits corresponding to that portion of the first set of encoded bits $E_1$. A choice can then be made (based on, for example, the condition of wireless channel 910) of whether to obtain only the higher-priority information bits (a first set of received information bits $I_1'$) from the set of received bits $E_2'$, or to obtain all of the information bits—that is, both the first set of received information bits $I_1'$ and a second set of received information bits $I_2'$—from the set of received bits $E_2'$.

If it is determined to obtain only the higher-priority information bits, a portion of the set of received bits $E_2'$ can be decoded at block 916 to obtain the first set of received information bits $I_1'$. According to aspects of the disclosure, in some examples in which the demapping at block 914 includes obtaining an additional set of received bits corresponding to the portion of the first set of encoded bits $E_1$ that includes the first set of parity bits, obtaining the first set of received information bits $I_1'$ at block 916 can involve decoding that additional set of received bits, along with the aforementioned portion of the set of received bits $E_2'$.

If it is determined to obtain all of the information bits, all (or substantially all) of the set of received bits $E_2'$ can be decoded at block 918 to obtain the first and second sets of received information bits $I_1'$ and $I_2'$. According to aspects of the disclosure, in some examples in which the demapping at block 914 includes obtaining an additional set of received bits corresponding to the portion of the first set of encoded bits $E_1$ that includes the first set of parity bits, obtaining the first and second sets of received information bits $I_1'$ and $I_2'$ at block 918 can involve decoding that additional set of received bits, along with all (or substantially all) of the set of received bits $E_2'$.

Figure 10:
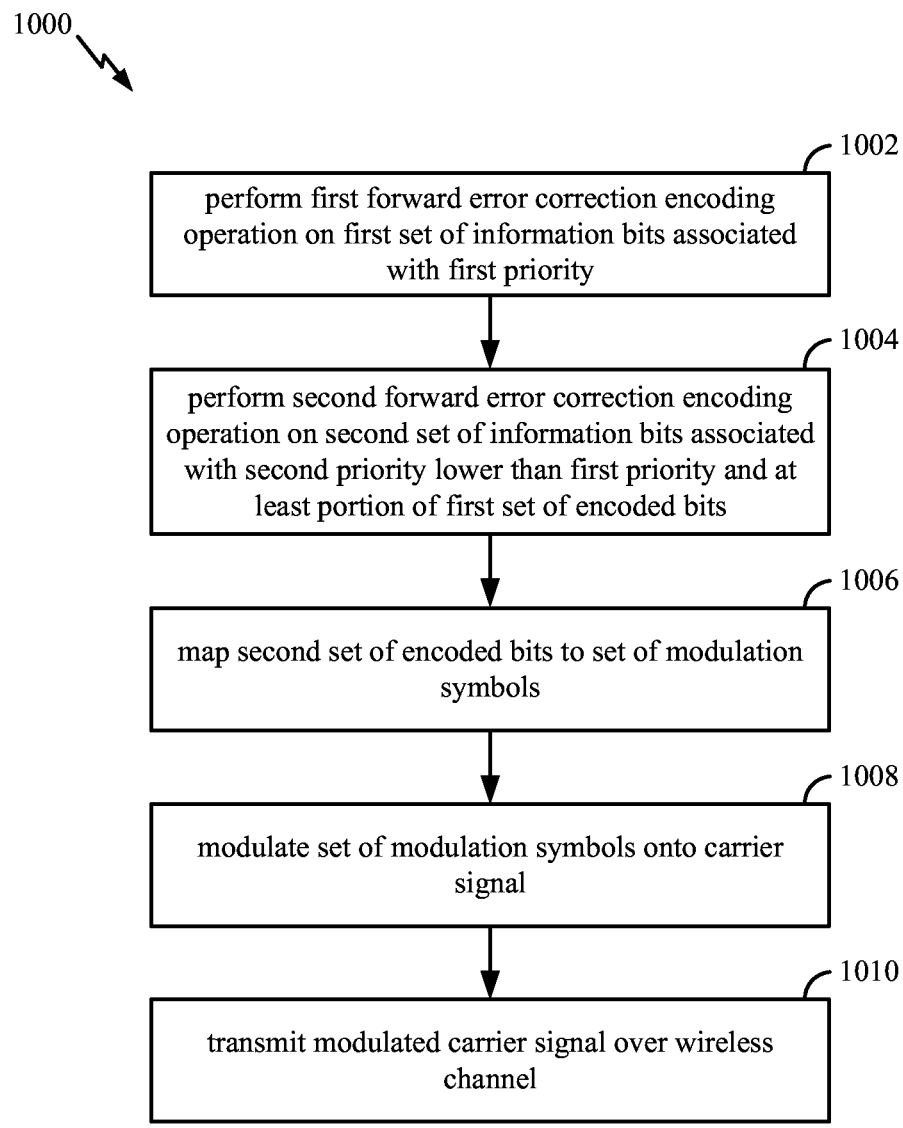
FIG. 10 shows a flowchart illustrating an example process that supports forward error correction encoding and modulation with reliability differentiation according to some examples.

FIG. 10 shows a flowchart illustrating an example process 1000 that supports forward error correction encoding and modulation with reliability differentiation according to some examples. The operations of the process 1000 may be implemented by a wireless communication device or its components as described herein. For example, according to some examples, the process 1000 may be performed by the source WCD 702 described above with reference to FIG. 7. According to some examples, the process 1000 may be performed in accordance with implementing a concatenated encoding technique, such as in conjunction with communication process 900 of FIG. 9.

In some examples, in block 1002, the wireless communication device can perform a first forward error correction encoding operation on a first set of information bits associated with a first priority. For example, in operating environment 700 of FIG. 7, source WCD 702 can perform a first forward error correction encoding operation on information bits 703-1, which can be associated with a first priority. Performance of the first forward error correction encoding operation in block 1002 can result in a first set of encoded bits that includes the first set of information bits and a first set of parity bits.

In some examples, in block 1004, the wireless communication device can perform a second forward error correction encoding operation on the first set of encoded bits and a second set of information bits associated with a second priority lower than the first priority. For example, in operating environment 700 of FIG. 7, source WCD 702 can perform a second forward error correction encoding operation on a first set of encoded bits generated via encoding of information bits 703-1 and on information bits 703-2, which can be associated with a second priority lower than a first priority with which information bits 703-1 are associated. Performance of the second forward error correction encoding operation in block 1004 can result in a second set of encoded bits that includes the first set of information bits, the first set of parity bits, the second set of information bits, and a second set of parity bits.

In some examples, in block 1004, the wireless communication device can perform the second forward error correction encoding operation on the second set of information bits and a portion of (as opposed to all of) the first set of encoded bits. For example, according to some examples, the wireless communication device can perform the second forward error correction encoding operation on the second set of information bits and a portion of the first set of encoded bits that includes the first set of information bits, and a portion of the first set of encoded bits that includes the first set of parity bits can be omitted from the second forward error correction encoding operation.

In some examples, the first and second forward error correction encoding operations can be LDPC encoding operations. In other examples, the first and second forward error correction encoding operations can be BCC encoding operations, linear block code encoding operations, or encoding operations associated with another type of forward error correction. In some examples, the first set of information bits can include bits of data associated with an application. In some examples, the first set of information bits can include bits of a first field of an MPDU (for example, an MPDU 416 of FIG. 4), and the second set of information bits can include bits of a second field of the MPDU. In some examples, the first set of information bits can include bits of a first MPDU (for example, bits of one or more fields of an MPDU 416 of FIG. 4), and the second set of information bits can include bits of a second MPDU (for example, bits of one or more fields of another MPDU 416 of FIG. 4). In some examples, the first set of information bits can include bits of a field of a PPDU (for example, bits of a field of a PPDU 300 of FIG. 3A or PPDU 350 of FIG. 3B).

In some examples, in block 1006, the wireless communication device can map the second set of encoded bits to a set of modulation symbols. For example, in operating environment 700 of FIG. 7, source WCD 702 can map a set of encoded bits 706 resulting from performance of the second forward error correction encoding operation in block 1004 to a set of modulation symbols 708. In some examples, mapping the second set of encoded bits to the set of modulation symbols in block 1006 can include mapping encoded bits associated with the first set of information bits to relatively higher reliability bit positions of a modulation constellation and mapping encoded bits associated with the second set of information bits to relatively lower reliability bit positions of the modulation constellation. For example, in operating environment 700 of FIG. 7, source WCD 702 can map encoded bits 706 that convey information bits 703-1 associated with the first priority to relatively higher reliability bit positions of a modulation constellation (for example, two relatively higher reliability bit positions of a ten-bit 1024-QAM constellation), and can map encoded bits 706 that convey information bits 703-2 associated with the second priority that is lower that the first priority to relatively lower reliability bit positions of the modulation constellation (for example, the remaining eight bit positions of the ten-bit 1024-QAM constellation). In some examples, the modulation constellation can comprise a QAM constellation, such as 16-QAM, 64-QAM, 256-QAM, 1024-QAM, or 4096-QAM. In some examples, the modulation constellation can be a constellation associated with another type of modulation scheme, such as a PSK, FSK, or ASK modulation scheme. In some examples, the portion of the first set of encoded bits that includes the first set of parity bits can be omitted from the second forward error correction encoding operation in block 1004, but can be mapped to relatively higher reliability bit positions of the modulation constellation in block 1006.

In some examples, a plurality of information bits can be divided into the first and second sets of information bits according to a bit prioritization parameter. For example, in operating environment 700 of FIG. 7, source WCD 702 can divide information bits 703 into the first and second sets of information bits 703-1 and 703-2 based on a bit prioritization parameter. According to aspects of the disclosure, the bit prioritization parameter can indicate, with respect to each of the set of modulation symbols generated in block 1006, a proportion of bit positions of the modulation constellation that constitute the relatively higher reliability bit positions of the modulation constellation. According to aspects of the disclosure, the bit prioritization parameter can serve as a basis for determining how many (and which) bit positions of a modulation constellation constitute relatively higher reliability bit positions. According to aspects of the disclosure, the plurality of information bits can be parsed into the first and second sets of information bits according to a ratio between the respective numbers of relatively higher reliability bit positions and relatively lower reliability bit positions in each modulation symbol, as indicated or implied by the bit prioritization parameter.

In some examples, in block 1008, the wireless communication device can modulate the set of modulation symbols onto a carrier signal. For example, in operating environment 700 of FIG. 7, source WCD 702 can modulate modulation symbols 708 onto a carrier signal to generate modulated carrier signal 709.

In some examples, in block 1010, the wireless communication device can transmit the modulated carrier signal over a wireless channel. For example, in operating environment 700 of FIG. 7, source WCD 702 can transmit modulated carrier signal 709 over wireless channel 710.

Figure 11:
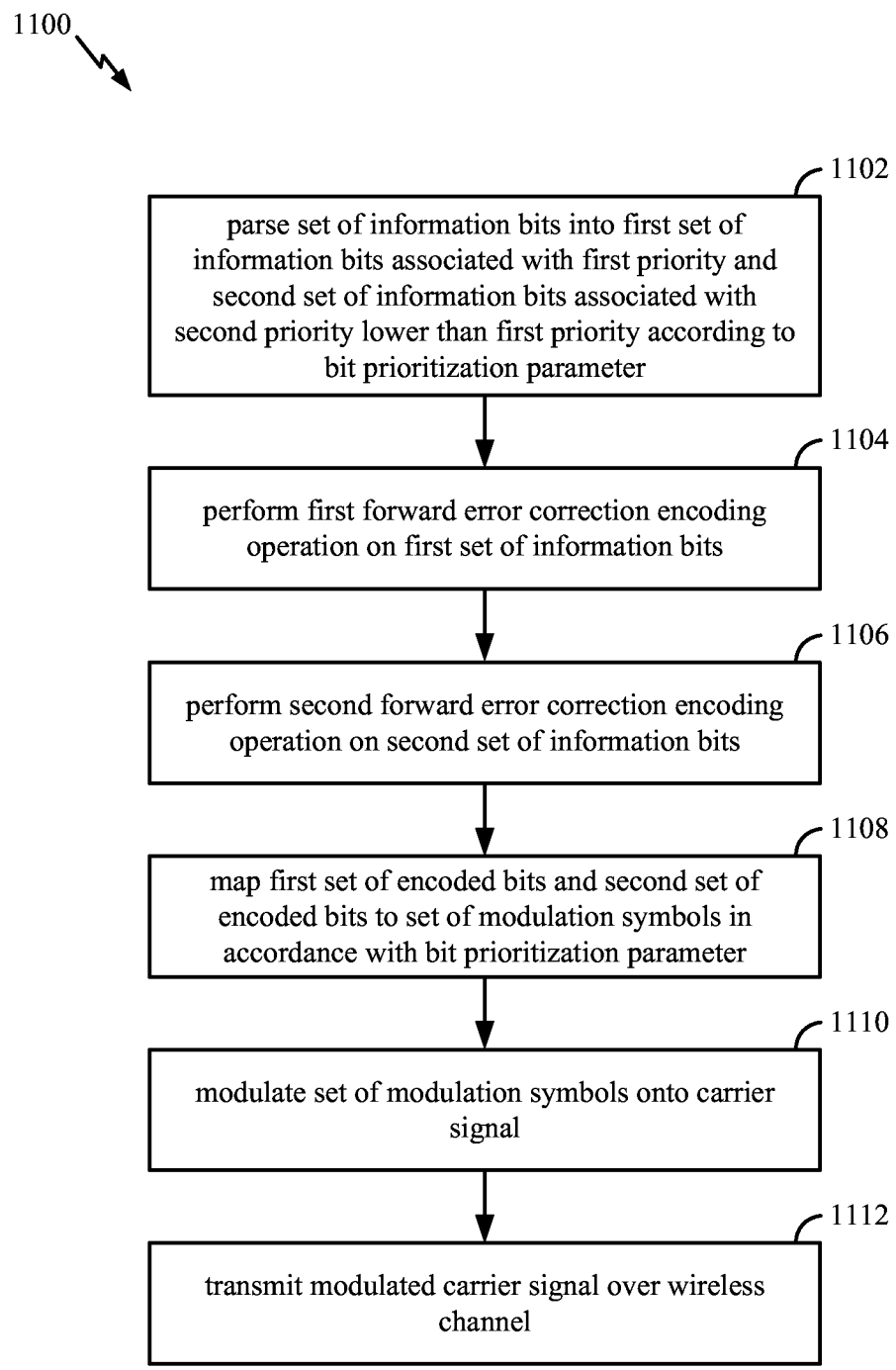
FIG. 11 shows a flowchart illustrating an example process that supports forward error correction encoding and modulation with reliability differentiation according to some examples.

FIG. 11 shows a flowchart illustrating an example process 1100 that supports forward error correction encoding and modulation with reliability differentiation according to some examples. The operations of the process 1100 may be implemented by a wireless communication device or its components as described herein. For example, according to some examples, the process 1100 may be performed by the source WCD 702 described above with reference to FIG. 7. According to some examples, the process 1100 may be performed in accordance with implementing a parallel encoding technique, such as in conjunction with communication process 800 of FIG. 8.

In some examples, in block 1102, the wireless communication device can parse a set of information bits into a first set of information bits associated with a first priority and a second set of information bits associated with a second priority lower than the first priority according to a bit prioritization parameter. For example, in operating environment 700 of FIG. 7, according to a bit prioritization parameter, source WCD 702 can parse a set of information bits 703 into a first set of information bits 703-1 associated with a first priority and a second set of information bits 703-2 associated with a second priority that is lower than the first priority.

In some examples, in block 1104, the wireless communication device can perform a first forward error correction encoding operation on the first set of information bits. For example, in operating environment 700 of FIG. 7, source WCD 702 can perform a first forward error correction encoding operation on the set of information bits 703-1.

According to aspects of the disclosure, the first forward error correction operation can result in a first set of encoded bits that includes the first set of information bits and a first set of parity bits.

In some examples, in block 1106, the wireless communication device can perform a second forward error correction encoding operation on the second set of information bits. For example, in operating environment 700 of FIG. 7, source WCD 702 can perform a second forward error correction encoding operation on the set of information bits 703-2. According to aspects of the disclosure, the second forward error correction operation can result in a second set of encoded bits that includes the second set of information bits and a second set of parity bits.

In some examples, the first and second forward error correction encoding operations can be LDPC encoding operations. In other examples, the first and second forward error correction encoding operations can be BCC encoding operations, linear block code encoding operations, or encoding operations associated with another type of forward error correction. In some examples, the first set of information bits can include bits of data associated with an application. In some examples, the first set of information bits can include bits of a first field of an MPDU (for example, an MPDU 416 of FIG. 4), and the second set of information bits can include bits of a second field of the MPDU. In some examples, the first set of information bits can include bits of a first MPDU (for example, bits of one or more fields of an MPDU 416 of FIG. 4), and the second set of information bits can include bits of a second MPDU (for example, bits of one or more fields of another MPDU 416 of FIG. 4). In some examples, the first set of information bits can include bits of a field of a PPDU (for example, bits of a field of a PPDU 300 of FIG. 3A or PPDU 350 of FIG. 3B).

In some examples, in block 1108, the wireless communication device can map the first set of encoded bits and the second set of encoded bits to a set of modulation symbols. For example, in operating environment 700 of FIG. 7, source WCD 702 can map, to modulation symbols 708, a set of encoded bits 706 conveying the set of information bits 703-1 and a set of encoded bits 706 conveying the set of information bits 703-2. According to aspects of the disclosure, mapping the first set of encoded bits and the second set of encoded bits to a set of modulation symbols in block 1108 can comprise, in accordance with the bit prioritization parameter, mapping encoded bits associated with the first set of information bits to relatively higher reliability bit positions of a modulation constellation and mapping encoded bits associated with the second set of information bits to relatively lower reliability bit positions of the modulation constellation. For example, in operating environment 700 of FIG. 7, in accordance with a bit prioritization parameter, source WCD 702 can map encoded bits 706 that convey information bits 703-1 associated with the first priority to relatively higher reliability bit positions of a modulation constellation (for example, two relatively higher reliability bit positions of a ten-bit 1024-QAM constellation), and can map encoded bits 706 that convey information bits 703-2 associated with the second priority that is lower that the first priority to relatively lower reliability bit positions of the modulation constellation (for example, the remaining eight bit positions of the ten-bit 1024-QAM constellation). In some examples, the bit prioritization parameter can indicate, with respect to each of the set of modulation symbols, a proportion of bit positions of the modulation constellation that constitute relatively higher reliability bit positions of the modulation constellation. In some examples, the modulation constellation can comprise a QAM constellation, such as 16-QAM, 64-QAM, 256-QAM, 1024-QAM, or 4096-QAM. In some examples, the modulation constellation can be a constellation associated with another type of modulation scheme, such as a PSK, FSK, or ASK modulation scheme.

According to aspects of the disclosure, the bit prioritization parameter can indicate, with respect to each of the set of modulation symbols generated in block 1108, a proportion of bit positions of the modulation constellation that constitute the relatively higher reliability bit positions of the modulation constellation. According to aspects of the disclosure, the bit prioritization parameter can serve as a basis for determining how many (and which) bit positions of a modulation constellation constitute relatively higher reliability bit positions. According to aspects of the disclosure, the set of information bits can be parsed into the first and second sets of information bits in block 1102 according to a ratio between the respective numbers of relatively higher reliability bit positions and relatively lower reliability bit positions in each modulation symbol, as indicated or implied by the bit prioritization parameter.

In some examples, in block 1110, the wireless communication device can modulate the set of modulation symbols onto a carrier signal. For example, in operating environment 700 of FIG. 7, source WCD 702 can modulate modulation symbols 708 onto a carrier signal to generate modulated carrier signal 709.

In some examples, in block 1112, the wireless communication device can transmit the modulated carrier signal over a wireless channel. For example, in operating environment 700 of FIG. 7, source WCD 702 can transmit modulated carrier signal 709 over wireless channel 710.

According to aspects of the disclosure, at some subsequent point in time, the bit prioritization parameter may be modified. In some examples, the bit prioritization parameter may be modified based on a state of the wireless channel. For instance, based on a determination that a channel quality of the wireless channel has decreased (for example, such that it has passed below a threshold), the bit prioritization parameter may be modified in such fashion as to treat fewer bit positions of the modulation constellation as relatively higher reliability bit positions suitable for conveying information bits of the first priority. Third and fourth sets of information bits may be obtained (for example, by parsing a second plurality of information bits in accordance with the modified bit prioritization parameter), and third and fourth forward error correction encoding operations may be performed on the third and fourth sets of information bits to obtain respective third and fourth sets of encoded bits. The third and fourth sets of encoded bits can be mapped to a second set of modulation symbols in accordance with the modified bit prioritization parameter. A second modulated carrier signal can then be generated by modulating the second set of modulation symbols onto a second carrier signal, and the second modulated carrier signal can be transmitted over the wireless channel.

Figure 12:
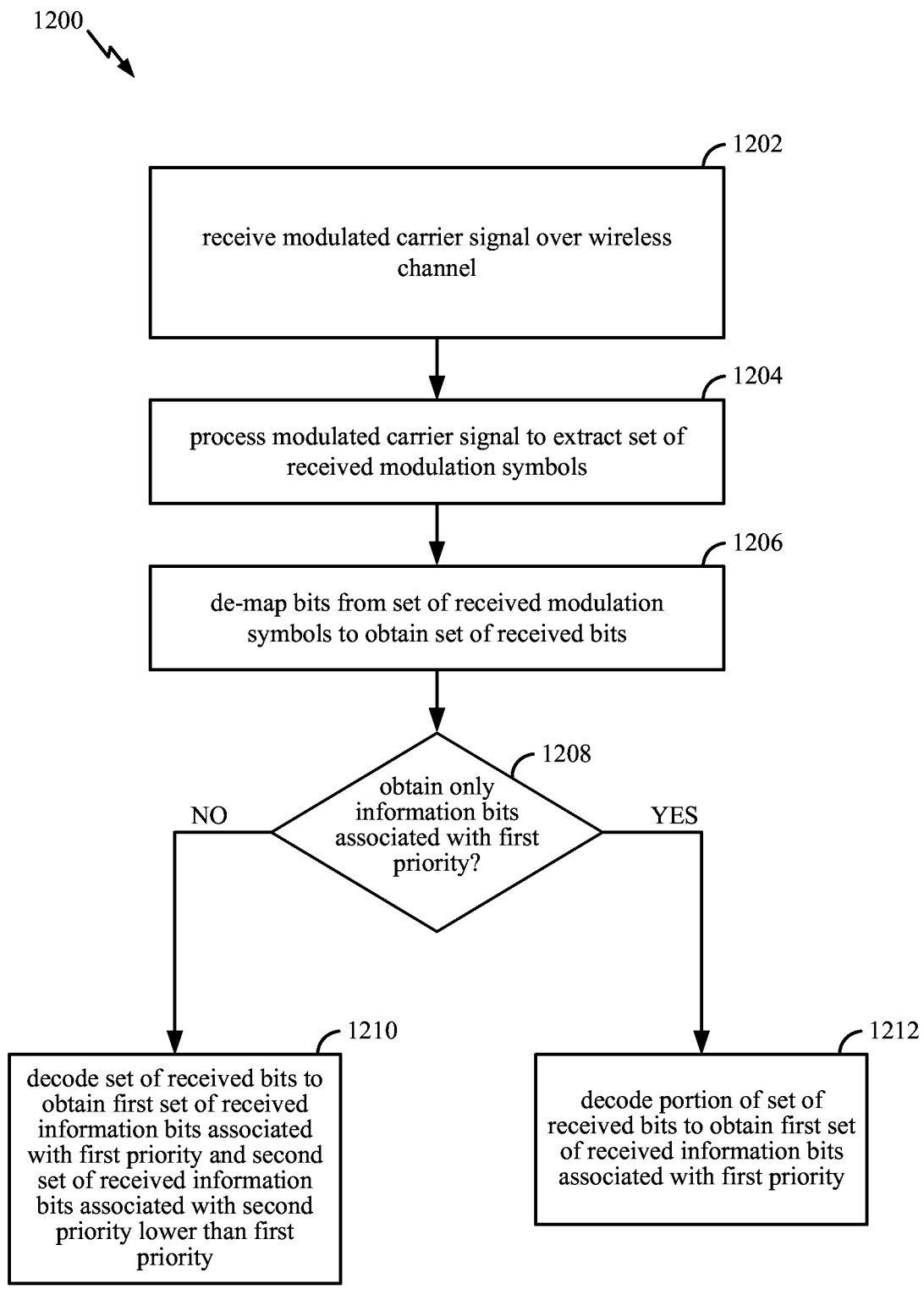
FIG. 12 shows a flowchart illustrating an example process that supports forward error correction decoding and demodulation with reliability differentiation according to some examples.

FIG. 12 shows a flowchart illustrating an example process 1200 that supports forward error correction decoding and demodulation with reliability differentiation according to some examples. The operations of the process 1200 may be implemented by a wireless communication device or its components as described herein. For example, according to some examples, the process 1200 may be performed by the destination WCD 704 described above with reference to FIG. 7. According to some examples, the process 1200 may be performed in accordance with implementing a concatenated encoding technique, such as in conjunction with communication process 900 of FIG. 9.

In some examples, in block 1202, the wireless communication device can receive a modulated carrier signal over a wireless channel. For example, in operating environment 700 of FIG. 7, destination WCD 704 can receive modulated carrier signal 709 over wireless channel 710.

In some examples, in block 1204, the wireless communication device can process the modulated carrier signal to extract a set of received modulation symbols. For example, in operating environment 700 of FIG. 7, destination WCD 704 can process modulated carrier signal 709 to extract a set of received modulation symbols 712.

In some examples, in block 1206, the wireless communication device can de-map bits from the set of received modulation symbols to obtain a set of received bits. For example, in operating environment 700 of FIG. 7, destination WCD 704 can de-map bits from the set of received modulation symbols 712 to obtain a set of received bits 714.

In some examples, in block 1208, the wireless communication device determines whether to obtain, from the set of received bits, only information bits associated with a first priority, or to obtain both the information bits associated with the first priority and information bits associated with a second priority that is lower than the first priority.

Responsive to a determination in block 1208 to obtain both information bits associated with the first priority and information bits associated with the second priority, the set of received bits obtained in block 1206 can be decoded in block 1210 to obtain a first set of received information bits associated with the first priority and a second set of received information bits associated with the second priority. For example, responsive to a determination in operating environment 700 of FIG. 7 to obtain both information bits associated with the first priority and information bits associated with the second priority, destination WCD 704 can decode the set of received bits 714 to obtain a first set of received information bits 716-1 associated with the first priority and a second set of received information bits 716-2 associated with the second priority.

Responsive to a determination in block 1208 to obtain only information bits associated with the first priority, a portion of the set of received bits obtained in block 1206 can be decoded in block 1212 to obtain the first set of received information bits associated with the first priority. For example, in operating environment 700 of FIG. 7, destination WCD 704 can decode a portion of the set of received bits 714 to obtain the set of received information bits 716-1, which can be associated with the first priority.

Figure 13:
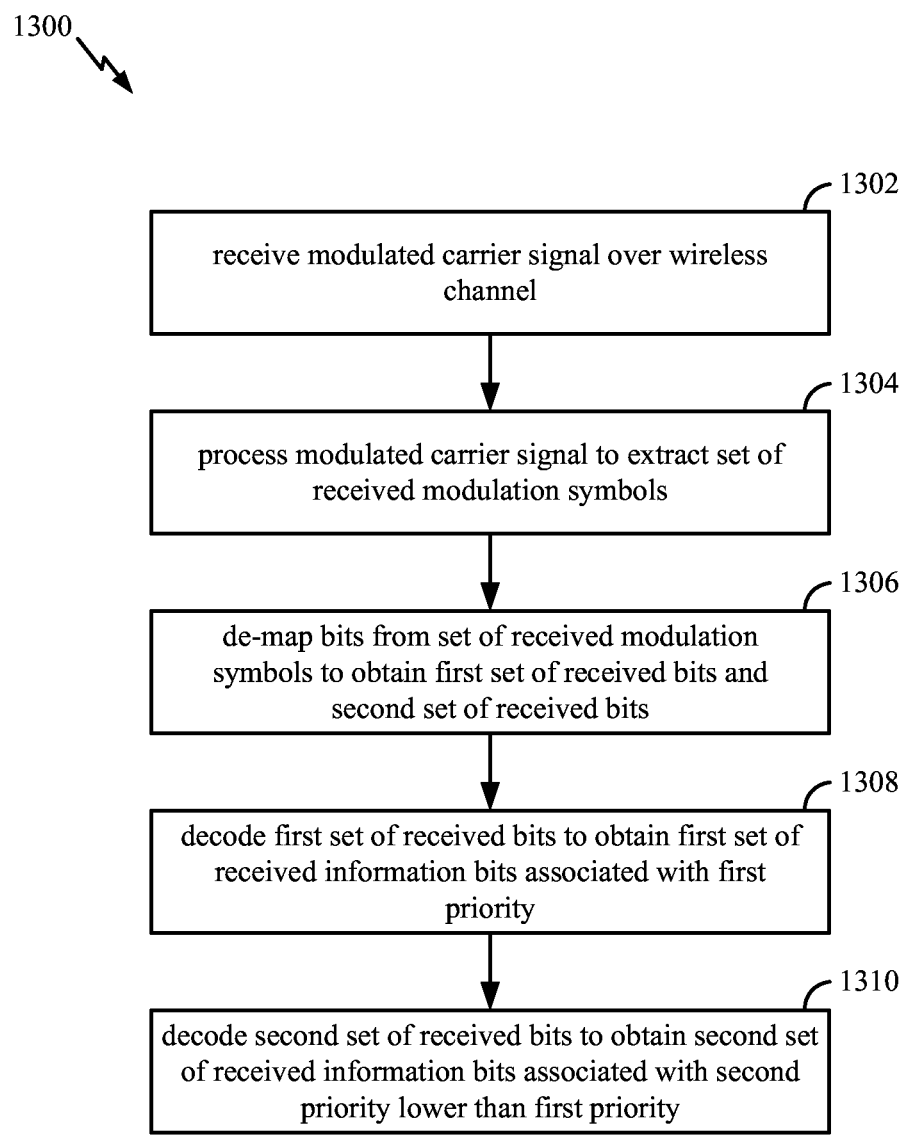
FIG. 13 shows a flowchart illustrating an example process that supports forward error correction decoding and demodulation with reliability differentiation according to some examples.

FIG. 13 shows a flowchart illustrating an example process 1300 that supports forward error correction decoding and demodulation with reliability differentiation according to some examples. The operations of the process 1300 may be implemented by a wireless communication device or its components as described herein. For example, according to some examples, the process 1300 may be performed by the destination WCD 704 described above with reference to FIG. 7. According to some examples, the process 1300 may be performed in accordance with implementing a parallel encoding technique, such as in conjunction with communication process 800 of FIG. 8.

In some examples, in block 1302, the wireless communication device can receive a modulated carrier signal over a wireless channel. For example, in operating environment 700 of FIG. 7, destination WCD 704 can receive modulated carrier signal 709 over wireless channel 710.

In some examples, in block 1304, the wireless communication device can process the modulated carrier signal to extract a set of received modulation symbols. For example, in operating environment 700 of FIG. 7, destination WCD 704 can process modulated carrier signal 709 to extract a set of received modulation symbols 712.

In some examples, in block 1306, the wireless communication device can de-map bits from the set of received modulation symbols to obtain a first set of received bits and a second set of received bits. For example, in operating environment 700 of FIG. 7, destination WCD 704 can de-map bits from the set of received modulation symbols 712 to obtain a first set of received bits 714 and a second set of received bits 714.

In some examples, in block 1308, the wireless communication device can decode the first set of received bits to obtain a first set of received information bits associated with a first priority. For example, in operating environment 700 of FIG. 7, destination WCD 704 can decode the first set of received bits obtained in block 1306 to obtain a first set of received information bits 716-1 associated with a first priority.

In some examples, in block 1310, the wireless communication device can decode the second set of received bits to obtain a second set of received information bits associated with a second priority that is lower than the first priority. For example, in operating environment 700 of FIG. 7, destination WCD 704 can decode the second set of received bits obtained in block 1306 to obtain a second set of received information bits 716-2 associated with a second priority that is lower than the first priority.

Figure 14:
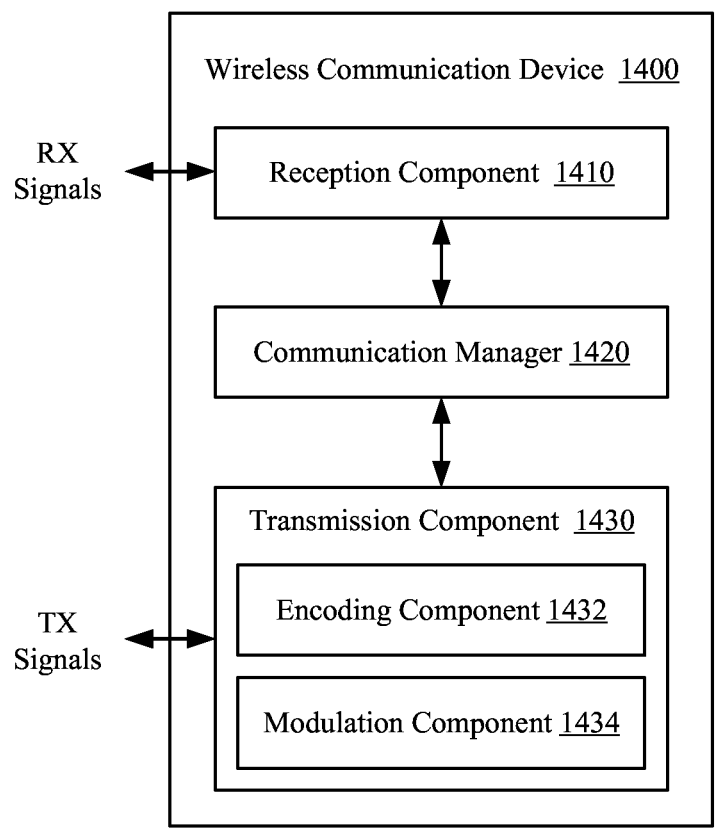
FIG. 14 shows a block diagram of an example wireless communication device that supports forward error correction encoding and modulation with reliability differentiation according to some examples.

FIG. 14 shows a block diagram of an example wireless communication device 1400 according to some examples. In some examples, the wireless communication device 1400 is configured to perform the process 1000 described above with reference to FIG. 10. The wireless communication device 1400 can be an example of the source WCD 702 described above with reference to FIG. 7. For example, the wireless communication device 1400 can be a chip, SoC, chipset, package or device that includes at least one processor and at least one modem (for example, a Wi-Fi (IEEE 802.11) modem or a cellular modem).

The wireless communication device 1400 includes a reception component 1410, a communication manager 1420, and a transmission component 1430. The transmission component 1430 further includes an encoding component 1432 and a modulation component 1434. Portions of one or more of the components 1410, 1420, 1430, 1432, and 1434 may be implemented at least in part in hardware or firmware. In some examples, at least some of the components 1410, 1420, 1430, 1432, and 1434 are implemented at least in part as software stored in a memory (such as the memory 508). For example, portions of one or more of the components 1410, 1420, 1430, 1432, and 1434 can be implemented as non-transitory instructions (or "code") executable by a processor (such as the processor 506) to perform the functions or operations of the respective component.

The reception component 1410 is configured to receive RX signals, over a wireless channel, from one or more other wireless communication devices. The communication manager 1420 is configured to control or manage communications with one or more other wireless communication devices. The transmission component 1430 is configured to transmit TX signals, over a wireless channel, to one or more other wireless communication devices.

In some examples, the encoding component 1432 may perform a first forward error correction encoding operation on a first set of information bits associated with a first priority that results in a first set of encoded bits that may include the first set of information bits and a first set of parity bits and perform a second forward error correction encoding operation on a portion of the first set of encoded bits and a second set of information bits associated with a second priority lower than the first priority, the performance of the second forward error correction encoding operation resulting in a second set of encoded bits that includes the first set of information bits, the second set of information bits, and a second set of parity bits.

In some examples, the modulation component 1434 may map the second set of encoded bits to a set of modulation symbols, the mapping comprising mapping encoded bits associated with the first set of information bits to relatively higher reliability bit positions of a modulation constellation and mapping encoded bits associated with the second set of information bits to relatively lower reliability bit positions of the modulation constellation, and may modulate the set of modulation symbols onto a carrier signal. In some examples, the transmission component 1430 may transmit the modulated carrier signal over a wireless channel.

Figure 15:
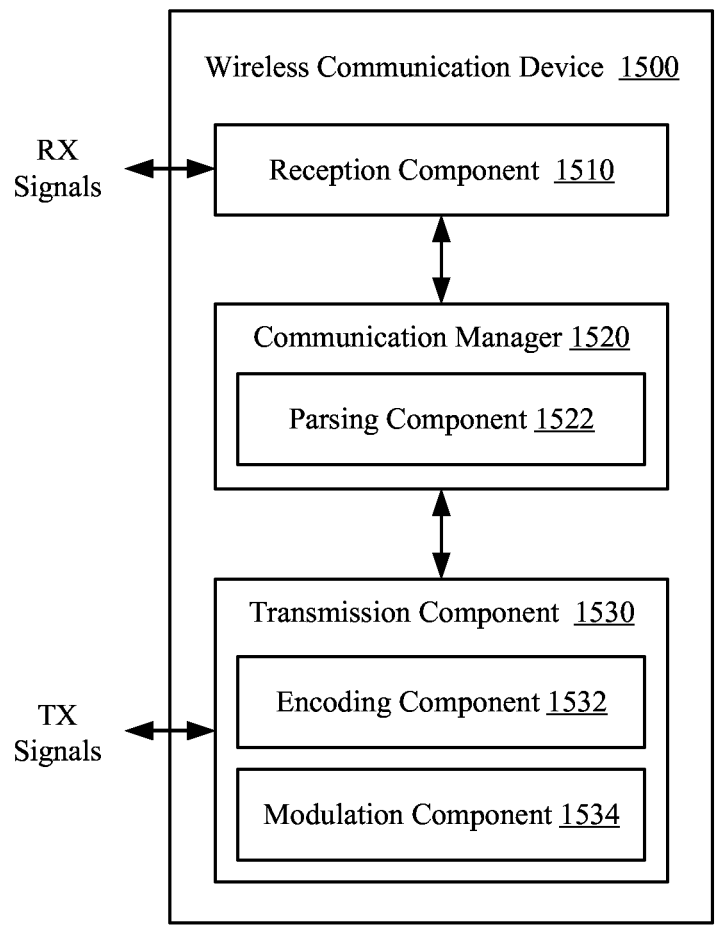
FIG. 15 shows a block diagram of an example wireless communication device that supports forward error correction encoding and modulation with reliability differentiation according to some examples.

FIG. 15 shows a block diagram of an example wireless communication device 1500 according to some examples. In some examples, the wireless communication device 1500 is configured to perform the process 1100 described above with reference to FIG. 11. The wireless communication device 1500 can be an example of the source WCD 702 described above with reference to FIG. 7. For example, the wireless communication device 1500 can be a chip, SoC, chipset, package or device that includes at least one processor and at least one modem (for example, a Wi-Fi (IEEE 802.11) modem or a cellular modem).

The wireless communication device 1500 includes a reception component 1510, a communication manager 1520, and a transmission component 1530. The communication manager 1520 further includes a parsing component 1522, and the transmission component 1530 further includes an encoding component 1532 and a modulation component 1534. Portions of one or more of the components 1510, 1520, 1522, 1530, 1532, and 1534 may be implemented at least in part in hardware or firmware. In some examples, at least some of the components 1510, 1520, 1522, 1530, 1532, and 1534 are implemented at least in part as software stored in a memory (such as the memory 508). For example, portions of one or more of the components 1510, 1520, 1522, 1530, 1532, and 1534 can be implemented as non-transitory instructions (or "code") executable by a processor (such as the processor 506) to perform the functions or operations of the respective component.

The reception component 1510 is configured to receive RX signals, over a wireless channel, from one or more other wireless communication devices. The communication manager 1520 is configured to control or manage communications with one or more other wireless communication devices. The transmission component 1530 is configured to transmit TX signals, over a wireless channel, to one or more other wireless communication devices.

In some examples, the parsing component 1522 may parse a set of information bits into a first set of information bits associated with a first priority and a second set of information bits associated with a second priority lower than the first priority according to a bit prioritization parameter.

In some examples, the encoding component 1532 may perform a first forward error correction encoding operation on the first set of information bits that results in a first set of encoded bits that may include the first set of information bits and a first set of parity bits and may perform a second forward error correction encoding operation on the second set of information bits that results in a second set of encoded bits that may include the second set of information bits and a second set of parity bits.

In some examples, the modulation component 1534 may map the first set of encoded bits and the second set of encoded bits to a set of modulation symbols, the mapping comprising, in accordance with the bit prioritization parameter, mapping encoded bits associated with the first set of information bits to relatively higher reliability bit positions of a modulation constellation and mapping encoded bits associated with the second set of information bits to relatively lower reliability bit positions of the modulation constellation, and may modulate the set of modulation symbols onto a carrier signal. In some examples, the transmission component 1530 may transmit the modulated carrier signal over a wireless channel.

Figure 16:
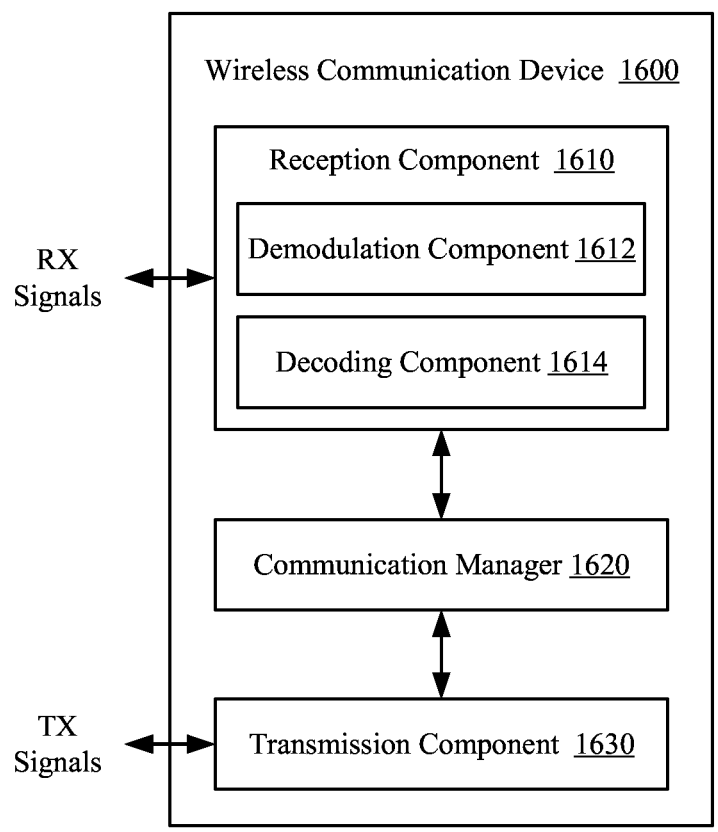
FIG. 16 shows a block diagram of an example wireless communication device that supports forward error correction decoding and demodulation with reliability differentiation according to some examples.

FIG. 16 shows a block diagram of an example wireless communication device 1600 according to some examples. In some examples, the wireless communication device 1600 is configured to perform the process 1200 described above with reference to FIG. 12. The wireless communication device 1600 can be an example of the destination WCD 704 described above with reference to FIG. 7. For example, the wireless communication device 1600 can be a chip, SoC, chipset, package or device that includes at least one processor and at least one modem (for example, a Wi-Fi (IEEE 802.11) modem or a cellular modem).

The wireless communication device 1600 includes a reception component 1610, a communication manager 1620, and a transmission component 1630. The reception component 1610 further includes an demodulation component 1612 and a decoding component 1614. Portions of one or more of the components 1610, 1612, 1614, 1620, and 1630 may be implemented at least in part in hardware or firmware. In some examples, at least some of the components 1610, 1612, 1614, 1620, and 1630 are implemented at least in part as software stored in a memory (such as the memory 508). For example, portions of one or more of the components 1610, 1612, 1614, 1620, and 1630 can be implemented as non-transitory instructions (or "code") executable by a processor (such as the processor 506) to perform the functions or operations of the respective component.

The reception component 1610 is configured to receive RX signals, over a wireless channel, from one or more other wireless communication devices. The communication manager 1620 is configured to control or manage communications with one or more other wireless communication devices. The transmission component 1630 is configured to transmit TX signals, over a wireless channel, to one or more other wireless communication devices.

In some examples, the reception component 1610 may receive a modulated carrier signal over a wireless channel.

In some examples, the demodulation component 1612 may process the modulated carrier signal to extract a set of received modulation symbols and de-map bits from the set of received modulation symbols to obtain a set of received bits.

In some examples, the decoding component 1614 may determine whether to obtain, from the set of received bits, only information bits associated with a first priority, or to obtain both the information bits associated with the first priority and information bits associated with a second priority that is lower than the first priority. In some examples, responsive to a determination to obtain both information bits associated with the first priority and information bits associated with the second priority, the decoding component 1614 can decode the set of received bits to obtain a first set of received information bits associated with the first priority and a second set of received information bits associated with the second priority. In some examples, responsive to a determination to obtain only information bits associated with the first priority, the decoding component 1614 can decode a portion of the set of received bits to obtain the first set of received information bits associated with the first priority.

Figure 17:
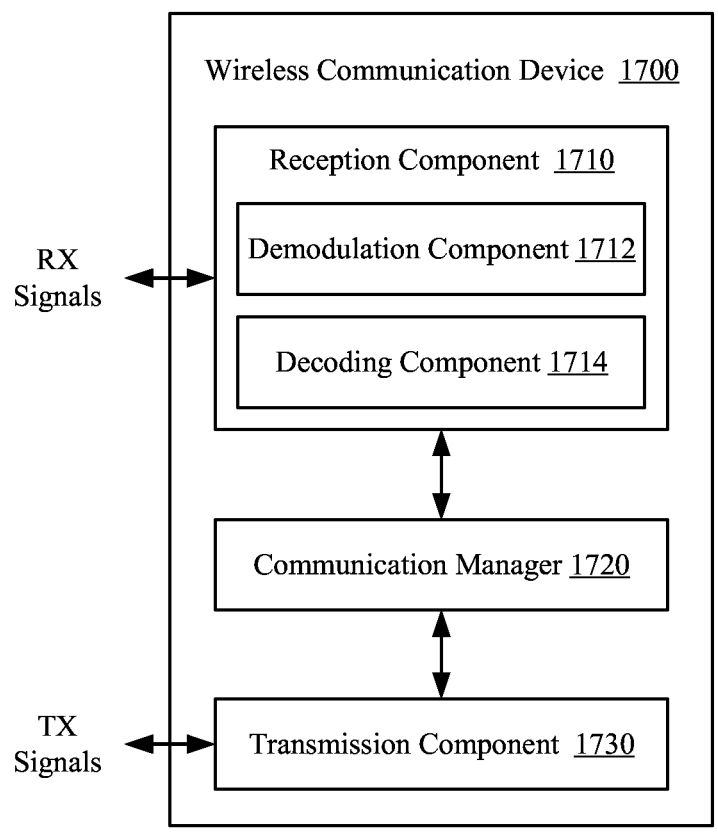
FIG. 17 shows a block diagram of an example wireless communication device that supports forward error correction decoding and demodulation with reliability differentiation according to some examples.

FIG. 17 shows a block diagram of an example wireless communication device 1700 according to some examples. In some examples, the wireless communication device 1700 is configured to perform the process 1300 described above with reference to FIG. 13. The wireless communication device 1700 can be an example of the destination WCD 704 described above with reference to FIG. 7. For example, the wireless communication device 1700 can be a chip, SoC, chipset, package or device that includes at least one processor and at least one modem (for example, a Wi-Fi (IEEE 802.11) modem or a cellular modem).

The wireless communication device 1700 includes a reception component 1710, a communication manager 1720, and a transmission component 1730. The reception component 1710 further includes an demodulation component 1712 and a decoding component 1714. Portions of one or more of the components 1710, 1712, 1714, 1720, and 1730 may be implemented at least in part in hardware or firmware. In some examples, at least some of the components 1710, 1712, 1714, 1720, and 1730 are implemented at least in part as software stored in a memory (such as the memory 508). For example, portions of one or more of the components 1710, 1712, 1714, 1720, and 1730 can be implemented as non-transitory instructions (or "code") executable by a processor (such as the processor 506) to perform the functions or operations of the respective component.

The reception component 1710 is configured to receive RX signals, over a wireless channel, from one or more other wireless communication devices. The communication manager 1720 is configured to control or manage communications with one or more other wireless communication devices. The transmission component 1730 is configured to transmit TX signals, over a wireless channel, to one or more other wireless communication devices.

In some examples, the reception component 1710 may receive a modulated carrier signal over a wireless channel.

In some examples, the demodulation component 1712 may process the modulated carrier signal to extract a set of received modulation symbols and de-map bits from the set of received modulation symbols to obtain a first set of received bits and a second set of received bits.

In some examples, the decoding component 1714 may decode the first set of received bits to obtain a first set of received information bits associated with a first priority and decode the second set of received bits to obtain a second set of received information bits associated with a second priority that is lower than the first priority.

Examples are described in the following numbered clauses:

Clause 1. A method for wireless communication by a wireless communication device, comprising performing a first forward error correction encoding operation on a first set of information bits associated with a first priority that results in a first set of encoded bits that includes the first set of information bits and a first set of parity bits, performing a second forward error correction encoding operation on a second set of information bits and at least a portion of the first set of encoded bits, the second set of information bits associated with a second priority lower than the first priority, the performance of the second forward error correction encoding operation resulting in a second set of encoded bits that includes the first set of information bits, the second set of information bits, and a second set of parity bits, mapping the second set of encoded bits to a set of modulation symbols, the mapping comprising mapping the first set of information bits to relatively higher reliability bit positions of a modulation constellation and mapping the second set of information bits to relatively lower reliability bit positions of the modulation constellation, modulating the set of modulation symbols onto a carrier signal, and transmitting the modulated carrier signal over a wireless channel.

Clause 2. The method of clause 1, further comprising dividing a plurality of information bits into the first set of information bits and the second set of information bits according to a bit prioritization parameter that indicates, with respect to each of the set of modulation symbols, a proportion of bit positions of the modulation constellation that constitute relatively higher reliability bit positions of the modulation constellation.

Clause 3. The method of any of clauses 1 to 2, wherein the first forward error correction encoding operation and the second forward error correction encoding operation are low-density parity-check (LDPC) encoding operations.

Clause 4. The method of any of clauses 1 to 3, wherein the first set of information bits includes bits of data associated with an application.

Clause 5. The method of any of clauses 1 to 4, wherein the first set of information bits includes bits of a first field of a medium access control (MAC) protocol data unit (MPDU) and the second set of information bits includes bits of a second field of the MPDU.

Clause 6. The method of any of clauses 1 to 5, wherein the first set of information bits includes bits of a first medium access control (MAC) protocol data unit (MPDU) and the second set of information bits includes bits of a second MPDU.

Clause 7. The method of any of clauses 1 to 6, wherein the first set of information bits includes bits of a field of a physical layer (PHY) protocol data unit (PPDU).

Clause 8. The method of any of clauses 1 to 7, wherein the modulation constellation comprises a quadrature amplitude modulation (QAM) constellation.

Clause 9. A wireless communication device, comprising at least one processor and at least one memory communicatively coupled with the at least one processor and storing processor-readable code that, when executed by the at least one processor, is configured to perform a first forward error correction encoding operation on a first set of information bits associated with a first priority that results in a first set of encoded bits that includes the first set of information bits and a first set of parity bits, perform a second forward error correction encoding operation on a second set of information bits and at least a portion of the first set of encoded bits, the second set of information bits associated with a second priority lower than the first priority, the performance of the second forward error correction encoding operation resulting in a second set of encoded bits that includes the first set of information bits, the second set of information bits, and a second set of parity bits, map the second set of encoded bits to a set of modulation symbols, the mapping comprising mapping the first set of information bits to relatively higher reliability bit positions of a modulation constellation and mapping the second set of information bits to relatively lower reliability bit positions of the modulation constellation, modulate the set of modulation symbols onto a carrier signal, and transmit the modulated carrier signal over a wireless channel.

Clause 10. The wireless communication device of clause 9, the at least one memory storing processor-readable code that, when executed by the at least one processor, is configured to divide a plurality of information bits into the first set of information bits and the second set of information bits according to a bit prioritization parameter that indicates, with respect to each of the set of modulation symbols, a proportion of bit positions of the modulation constellation that constitute relatively higher reliability bit positions of the modulation constellation.

Clause 11. The wireless communication device of any of clauses 9 to 10, wherein the first forward error correction encoding operation and the second forward error correction encoding operation are low-density parity-check (LDPC) encoding operations.

Clause 12. The wireless communication device of any of clauses 9 to 11, wherein the first set of information bits includes bits of data associated with an application.

Clause 13. The wireless communication device of any of clauses 9 to 12, wherein the first set of information bits includes bits of a first field of a medium access control (MAC) protocol data unit (MPDU) and the second set of information bits includes bits of a second field of the MPDU.

Clause 14. The wireless communication device of any of clauses 9 to 13, wherein the first set of information bits includes bits of a first medium access control (MAC) protocol data unit (MPDU) and the second set of information bits includes bits of a second MPDU.

Clause 15. The wireless communication device of any of clauses 9 to 14, wherein the first set of information bits includes bits of a field of a physical layer (PHY) protocol data unit (PPDU).

Clause 16. The wireless communication device of any of clauses 9 to 15, wherein the modulation constellation comprises a quadrature amplitude modulation (QAM) constellation.

Clause 17. A method for wireless communication by a wireless communication device, comprising parsing a set of information bits into a first set of information bits associated with a first priority and a second set of information bits associated with a second priority lower than the first priority according to a bit prioritization parameter, performing a first forward error correction encoding operation on the first set of information bits that results in a first set of encoded bits that includes the first set of information bits and a first set of parity bits, performing a second forward error correction encoding operation on the second set of information bits that results in a second set of encoded bits that includes the second set of information bits and a second set of parity bits, mapping the first set of encoded bits and the second set of encoded bits to a set of modulation symbols, the mapping comprising, in accordance with the bit prioritization parameter, mapping the first set of information bits to relatively higher reliability bit positions of a modulation constellation and mapping the second set of information bits to relatively lower reliability bit positions of the modulation constellation, modulating the set of modulation symbols onto a carrier signal, and transmitting the modulated carrier signal over a wireless channel.

Clause 18. The method of clause 17, further comprising modifying the bit prioritization parameter based on a state of the wireless channel, mapping a third set of encoded bits and a fourth set of encoded bits to a second set of modulation symbols in accordance with the modified bit prioritization parameter, modulating the second set of modulation symbols onto a second carrier signal, and transmitting the second modulated carrier signal over the wireless channel.

Clause 19. The method of any of clauses 17 to 18, wherein the bit prioritization parameter indicates, with respect to each of the set of modulation symbols, a proportion of bit positions of the modulation constellation that constitute relatively higher reliability bit positions of the modulation constellation.

Clause 20. The method of any of clauses 17 to 19, wherein the first forward error correction encoding operation and the second forward error correction encoding operation are low-density parity-check (LDPC) encoding operations.

Clause 21. The method of any of clauses 17 to 20, wherein the first set of information bits includes bits of data associated with an application.

Clause 22. The method of any of clauses 17 to 21, wherein the first set of information bits includes bits of a first field of a medium access control (MAC) protocol data unit (MPDU) and the second set of information bits includes bits of a second field of the MPDU.

Clause 23. The method of any of clauses 17 to 22, wherein the first set of information bits includes bits of a first medium access control (MAC) protocol data unit (MPDU) and the second set of information bits includes bits of a second MPDU.

Clause 24. The method of any of clauses 17 to 23, wherein the first set of information bits includes bits of a field of a physical layer (PHY) protocol data unit (PPDU).

Clause 25. The method of any of clauses 17 to 24, wherein the modulation constellation comprises a quadrature amplitude modulation (QAM) constellation.

Clause 26. A wireless communication device, comprising at least one processor and at least one memory communicatively coupled with the at least one processor and storing processor-readable code that, when executed by the at least one processor, is configured to parse a set of information bits into a first set of information bits associated with a first priority and a second set of information bits associated with a second priority lower than the first priority according to a bit prioritization parameter, perform a first forward error correction encoding operation on the first set of information bits that results in a first set of encoded bits that includes the first set of information bits and a first set of parity bits, perform a second forward error correction encoding operation on the second set of information bits that results in a second set of encoded bits that includes the second set of information bits and a second set of parity bits, map the first set of encoded bits and the second set of encoded bits to a set of modulation symbols, the mapping comprising, in accordance with the bit prioritization parameter, mapping the first set of information bits to relatively higher reliability bit positions of a modulation constellation and mapping the second set of information bits to relatively lower reliability bit positions of the modulation constellation, modulate the set of modulation symbols onto a carrier signal, and transmit the modulated carrier signal over a wireless channel.

Clause 27. The wireless communication device of clause 26, the at least one memory storing processor-readable code that, when executed by the at least one processor, is configured to modify the bit prioritization parameter based on a state of the wireless channel, map a third set of encoded bits and a fourth set of encoded bits to a second set of modulation symbols in accordance with the modified bit prioritization parameter, modulate the second set of modulation symbols onto a second carrier signal, and transmit the second modulated carrier signal over the wireless channel.

Clause 28. The wireless communication device of any of clauses 26 to 27, wherein the bit prioritization parameter indicates, with respect to each of the set of modulation symbols, a proportion of bit positions of the modulation constellation that constitute relatively higher reliability bit positions of the modulation constellation.

Clause 29. The wireless communication device of any of clauses 26 to 28, wherein the first forward error correction encoding operation and the second forward error correction encoding operation are low-density parity-check (LDPC) encoding operations.

Clause 30. The wireless communication device of any of clauses 26 to 29, wherein the first set of information bits includes bits of data associated with an application.

Clause 31. The wireless communication device of any of clauses 26 to 30, wherein the first set of information bits includes bits of a first field of a medium access control (MAC) protocol data unit (MPDU) and the second set of information bits includes bits of a second field of the MPDU.

Clause 32. The wireless communication device of any of clauses 26 to 31, wherein the first set of information bits includes bits of a first medium access control (MAC) protocol data unit (MPDU) and the second set of information bits includes bits of a second MPDU.

Clause 33. The wireless communication device of any of clauses 26 to 32, wherein the first set of information bits includes bits of a field of a physical layer (PHY) protocol data unit (PPDU).

Clause 34. The wireless communication device of any of clauses 26 to 33, wherein the modulation constellation comprises a quadrature amplitude modulation (QAM) constellation.

Clause 35. A method for wireless communication by a wireless communication device, comprising receiving a modulated carrier signal over a wireless channel, processing the modulated carrier signal to extract a set of received modulation symbols, de-mapping bits from the set of received modulation symbols to obtain a set of received bits, and determining whether to obtain, from the set of received bits, only information bits associated with a first priority, or to obtain both the information bits associated with the first priority and information bits associated with a second priority that is lower than the first priority.

Clause 36. The method of clause 35, further comprising decoding the set of received bits to obtain a first set of received information bits associated with the first priority and a second set of received information bits associated with the second priority.

Clause 37. The method of clause 35, further comprising decoding a portion of the set of received bits to obtain a first set of received information bits associated with the first priority.

Clause 38. The method of any of clauses 35 to 37, wherein the information bits associated with the first priority include bits of data associated with an application.

Clause 39. The method of any of clauses 35 to 38, wherein the information bits associated with the first priority include bits of a first field of a medium access control (MAC) protocol data unit (MPDU) and the information bits associated with the second priority include bits of a second field of the MPDU.

Clause 40. The method of any of clauses 35 to 39, wherein the information bits associated with the first priority include bits of a first medium access control (MAC) protocol data unit (MPDU) and the information bits associated with the second priority include bits of a second MPDU.

Clause 41. The method of any of clauses 35 to 40, wherein the information bits associated with the first priority include bits of a field of a physical layer (PHY) protocol data unit (PPDU).

Clause 42. The method of any of clauses 35 to 41, wherein the modulation symbols are modulation symbols of a quadrature amplitude modulation (QAM) constellation.

Clause 43. A wireless communication device, comprising at least one processor and at least one memory communicatively coupled with the at least one processor and storing processor-readable code that, when executed by the at least one processor, is configured to receive a modulated carrier signal over a wireless channel, process the modulated carrier signal to extract a set of received modulation symbols, de-map bits from the set of received modulation symbols to obtain a set of received bits, and determine whether to obtain, from the set of received bits, only information bits associated with a first priority, or to obtain both the information bits associated with the first priority and information bits associated with a second priority that is lower than the first priority.

Clause 44. The wireless communication device of clause 43, the at least one memory storing processor-readable code that, when executed by the at least one processor, is configured to decode the set of received bits to obtain a first set of received information bits associated with the first priority and a second set of received information bits associated with the second priority.

Clause 45. The wireless communication device of clause 43, the at least one memory storing processor-readable code that, when executed by the at least one processor, is configured to decode a portion of the set of received bits to obtain a first set of received information bits associated with the first priority.

Clause 46. The wireless communication device of any of clauses 43 to 45, wherein the information bits associated with the first priority include bits of data associated with an application.

Clause 47. The wireless communication device of any of clauses 43 to 46, wherein the information bits associated with the first priority include bits of a first field of a medium access control (MAC) protocol data unit (MPDU) and the information bits associated with the second priority include bits of a second field of the MPDU.

Clause 48. The wireless communication device of any of clauses 43 to 47, wherein the information bits associated with the first priority include bits of a first medium access control (MAC) protocol data unit (MPDU) and the information bits associated with the second priority include bits of a second MPDU.

Clause 49. The wireless communication device of any of clauses 43 to 48, wherein the information bits associated with the first priority include bits of a field of a physical layer (PHY) protocol data unit (PPDU).

Clause 50. The wireless communication device of any of clauses 43 to 49, wherein the modulation symbols are modulation symbols of a quadrature amplitude modulation (QAM) constellation.

Clause 51. A method for wireless communication by a wireless communication device, comprising receiving a modulated carrier signal over a wireless channel, processing the modulated carrier signal to extract a set of received modulation symbols, de-mapping bits from the set of received modulation symbols to obtain a first set of received bits and a second set of received bits, decoding the first set of received bits to obtain a first set of received information bits associated with a first priority, and decoding the second set of received bits to obtain a second set of received information bits associated with a second priority that is lower than the first priority.

Clause 52. The method of clause 51, wherein the information bits associated with the first priority include bits of data associated with an application.

Clause 53. The method of any of clauses 51 to 52, wherein the information bits associated with the first priority include bits of a first field of a medium access control (MAC) protocol data unit (MPDU) and the information bits associated with the second priority include bits of a second field of the MPDU.

Clause 54. The method of any of clauses 51 to 53, wherein the information bits associated with the first priority include bits of a first medium access control (MAC) protocol data unit (MPDU) and the information bits associated with the second priority include bits of a second MPDU.

Clause 55. The method of any of clauses 51 to 54, wherein the information bits associated with the first priority include bits of a field of a physical layer (PHY) protocol data unit (PPDU).

Clause 56. The method of any of clauses 51 to 55, wherein the modulation symbols are modulation symbols of a quadrature amplitude modulation (QAM) constellation.

Clause 57. A wireless communication device, comprising at least one processor and at least one memory communicatively coupled with the at least one processor and storing processor-readable code that, when executed by the at least one processor, is configured to receive a modulated carrier signal over a wireless channel, process the modulated carrier signal to extract a set of received modulation symbols, de-map bits from the set of received modulation symbols to obtain a first set of received bits and a second set of received bits, decode the first set of received bits to obtain a first set of received information bits associated with a first priority, and decode the second set of received bits to obtain a second set of received information bits associated with a second priority that is lower than the first priority.

Clause 58. The wireless communication device of clause 57, wherein the information bits associated with the first priority include bits of data associated with an application.

Clause 59. The wireless communication device of any of clauses 57 to 58, wherein the information bits associated with the first priority include bits of a first field of a medium access control (MAC) protocol data unit (MPDU) and the information bits associated with the second priority include bits of a second field of the MPDU.

Clause 60. The wireless communication device of any of clauses 57 to 59, wherein the information bits associated with the first priority include bits of a first medium access control (MAC) protocol data unit (MPDU) and the information bits associated with the second priority include bits of a second MPDU.

Clause 61. The wireless communication device of any of clauses 57 to 60, wherein the information bits associated with the first priority include bits of a field of a physical layer (PHY) protocol data unit (PPDU).

Clause 62. The wireless communication device of any of clauses 57 to 61, wherein the modulation symbols are modulation symbols of a quadrature amplitude modulation (QAM) constellation.

As used herein, "or" is used intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the examples of: a only, b only, c only, a combination of a and b, a combination of a and c, a combination of b and c, and a combination of a and b and c.

The various illustrative components, logic, logical blocks, modules, circuits, operations and algorithm processes described in connection with the examples disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the examples described in this disclosure may be readily apparent to persons having ordinary skill in the art, and the generic principles defined herein may be applied to other examples without departing from the spirit or scope of this disclosure. Thus, the claims are not intended to be limited to the examples shown herein, but are to be accorded the widest scope consistent with this disclosure, the principles and the novel features disclosed herein.

Additionally, various features that are described in this specification in the context of separate examples also can be implemented in combination in a single example. Conversely, various features that are described in the context of a single example also can be implemented in multiple examples separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

What is claimed is:

1. A method for wireless communication by a wireless communication device, comprising:
performing a first forward error correction encoding operation on a first set of information bits associated with a first priority that results in a first set of encoded bits that includes the first set of information bits and a first set of parity bits;

performing a second forward error correction encoding operation on a second set of information bits and at least a portion of the first set of encoded bits that includes at least a portion of the first set of information bits and that does not include the first set of parity bits, the second set of information bits associated with a second priority lower than the first priority, the performance of the second forward error correction encoding operation resulting in a second set of encoded bits that includes the first set of information bits, the second set of information bits, and a second set of parity bits;

mapping the second set of encoded bits to a set of modulation symbols, the mapping comprising:
  mapping the first set of information bits to relatively higher reliability bit positions of a modulation constellation; and
  mapping the second set of information bits to relatively lower reliability bit positions of the modulation constellation;

modulating the set of modulation symbols onto a carrier signal; and transmitting the modulated carrier signal over a wireless channel; and mapping a portion of the first set of encoded bits that includes the first set of parity bits omitted from the second set of encoded bits to relatively higher reliability bit positions of the modulation constellation of the set of modulation symbols.

2. The method of claim 1, further comprising dividing a plurality of information bits into the first set of information bits and the second set of information bits according to a bit prioritization parameter that indicates, with respect to each of the set of modulation symbols, a proportion of bit positions of the modulation constellation that constitute relatively higher reliability bit positions of the modulation constellation.

3. The method of claim 1, wherein the first forward error correction encoding operation and the second forward error correction encoding operation are low-density parity-check (LDPC) encoding operations.

4. The method of claim 1, wherein the first set of information bits includes bits of data associated with an application.

5. The method of claim 1, wherein the first set of information bits includes bits of a first field of a medium access control (MAC) protocol data unit (MPDU) and the second set of information bits includes bits of a second field of the MPDU.

6. The method of claim 1, wherein the first set of information bits includes bits of a first medium access control (MAC) protocol data unit (MPDU) and the second set of information bits includes bits of a second MPDU.

7. The method of claim 1, wherein the first set of information bits includes bits of a field of a physical layer (PHY) protocol data unit (PPDU).

8. The method of claim 1, wherein the modulation constellation comprises a quadrature amplitude modulation (QAM) constellation.

9. A wireless communication device, comprising:
at least one processor; and
at least one memory communicatively coupled with the at least one processor and storing processor-readable code that, when executed by the at least one processor, is configured to:
perform a first forward error correction encoding operation on a first set of information bits associated with a first priority that results in a first set of encoded bits that includes the first set of information bits and a first set of parity bits;

perform a second forward error correction encoding operation on a second set of information bits and at least a portion of the first set of encoded bits that includes at least a portion of the first set of information bits and that does not include the first set of parity bits, the second set of information bits associated with a second priority lower than the first priority, the performance of the second forward error correction encoding operation resulting in a second set of encoded bits that includes the first set of information bits, the second set of information bits, and a second set of parity bits;

map the second set of encoded bits to a set of modulation symbols, the mapping comprising:
  mapping the first set of information bits to relatively higher reliability bit positions of a modulation constellation; and
  mapping the second set of information bits to relatively lower reliability bit positions of the modulation constellation;

modulate the set of modulation symbols onto a carrier signal; and transmit the modulated carrier signal over a wireless channel; and map a portion of the first set of encoded bits that includes the first set of parity bits omitted from the second set of encoded bits to relatively higher reliability bit positions of the modulation constellation of the set of modulation symbols.

10. The wireless communication device of claim 9, the at least one memory storing processor-readable code that, when executed by the at least one processor, is configured to divide a plurality of information bits into the first set of information bits and the second set of information bits according to a bit prioritization parameter that indicates, with respect to each of the set of modulation symbols, a proportion of bit positions of the modulation constellation that constitute relatively higher reliability bit positions of the modulation constellation.

11. The wireless communication device of claim 9, wherein the first forward error correction encoding operation and the second forward error correction encoding operation are low-density parity-check (LDPC) encoding operations.

12. The wireless communication device of claim 9, wherein the first set of information bits includes bits of data associated with an application.

13. The wireless communication device of claim 9, wherein the first set of information bits includes bits of a first field of a medium access control (MAC) protocol data unit (MPDU) and the second set of information bits includes bits of a second field of the MPDU.

14. The wireless communication device of claim 9, wherein the first set of information bits includes bits of a first medium access control (MAC) protocol data unit (MPDU) and the second set of information bits includes bits of a second MPDU.

15. The wireless communication device of claim 9, wherein the first set of information bits includes bits of a field of a physical layer (PHY) protocol data unit (PPDU).

16. The wireless communication device of claim 9, wherein the modulation constellation comprises a quadrature amplitude modulation (QAM) constellation.

17. A method for wireless communication by a wireless communication device, comprising:

parsing a set of information bits into a first set of information bits associated with a first priority and a second set of information bits associated with a second priority lower than the first priority according to a bit prioritization parameter associated with a state of a wireless channel;

performing a first forward error correction encoding operation on the first set of information bits that results in a first set of encoded bits that includes the first set of information bits and a first set of parity bits;

performing a second forward error correction encoding operation on the second set of information bits that results in a second set of encoded bits that includes the second set of information bits and a second set of parity bits;

mapping the first set of encoded bits and the second set of encoded bits to a set of modulation symbols, the mapping comprising, in accordance with the bit prioritization parameter, mapping the first set of information bits to relatively higher reliability bit positions of a modulation constellation and mapping the second set of information bits to relatively lower reliability bit positions of the modulation constellation;

modulating the set of modulation symbols onto a carrier signal; and transmitting the modulated carrier signal over the wireless channel.

18. The method of claim 17, further comprising:
modifying the bit prioritization parameter based on the state of the wireless channel;
mapping a third set of encoded bits and a fourth set of encoded bits to a second set of modulation symbols in accordance with the modified bit prioritization parameter;
modulating the second set of modulation symbols onto a second carrier signal; and
transmitting the second modulated carrier signal over the wireless channel.

19. The method of claim 17, wherein the bit prioritization parameter indicates, with respect to each of the set of modulation symbols, a proportion of bit positions of the modulation constellation that constitute relatively higher reliability bit positions of the modulation constellation.

20. The method of claim 17, wherein the first forward error correction encoding operation and the second forward error correction encoding operation are low-density parity-check (LDPC) encoding operations.

21. The method of claim 17, wherein the first set of information bits includes bits of data associated with an application.

22. The method of claim 17, wherein the first set of information bits includes bits of a first field of a medium access control (MAC) protocol data unit (MPDU) and the second set of information bits includes bits of a second field of the MPDU.

23. The method of claim 17, wherein the first set of information bits includes bits of a first medium access control (MAC) protocol data unit (MPDU) and the second set of information bits includes bits of a second MPDU.

24. The method of claim 17, wherein the first set of information bits includes bits of a field of a physical layer (PHY) protocol data unit (PPDU).

25. The method of claim 17, wherein the modulation constellation comprises a quadrature amplitude modulation (QAM) constellation.

26. A wireless communication device, comprising:
at least one processor; and
at least one memory communicatively coupled with the at least one processor and storing processor-readable code that, when executed by the at least one processor, is configured to:
parse a set of information bits into a first set of information bits associated with a first priority and a second set of information bits associated with a second priority lower than the first priority according to a bit prioritization parameter associated with a state of a wireless channel;
perform a first forward error correction encoding operation on the first set of information bits that results in a first set of encoded bits that includes the first set of information bits and a first set of parity bits;
perform a second forward error correction encoding operation on the second set of information bits that results in a second set of encoded bits that includes the second set of information bits and a second set of parity bits;
map the first set of encoded bits and the second set of encoded bits to a set of modulation symbols, the mapping comprising, in accordance with the bit prioritization parameter, mapping the first set of information bits to relatively higher reliability bit positions of a modulation constellation and mapping the second set of information bits to relatively lower reliability bit positions of the modulation constellation;
modulate the set of modulation symbols onto a carrier signal; and
transmit the modulated carrier signal over the wireless channel.

27. The wireless communication device of claim 26, the at least one memory storing processor-readable code that, when executed by the at least one processor, is configured to:
modify the bit prioritization parameter based on the state of the wireless channel;
map a third set of encoded bits and a fourth set of encoded bits to a second set of modulation symbols in accordance with the modified bit prioritization parameter;
modulate the second set of modulation symbols onto a second carrier signal; and
transmit the second modulated carrier signal over the wireless channel.

28. The wireless communication device of claim 26, wherein the bit prioritization parameter indicates, with respect to each of the set of modulation symbols, a proportion of bit positions of the modulation constellation that constitute relatively higher reliability bit positions of the modulation constellation.

29. The wireless communication device of claim 26, wherein the first forward error correction encoding operation and the second forward error correction encoding operation are low-density parity-check (LDPC) encoding operations.

30. The wireless communication device of claim 26, wherein the first set of information bits includes bits of data associated with an application.

31. The wireless communication device of claim 26, wherein the first set of information bits includes bits of a first field of a medium access control (MAC) protocol data unit (MPDU) and the second set of information bits includes bits of a second field of the MPDU.

32. The wireless communication device of claim 26, wherein the first set of information bits includes bits of a first medium access control (MAC) protocol data unit (MPDU) and the second set of information bits includes bits of a second MPDU.

33. The wireless communication device of claim 26, wherein the first set of information bits includes bits of a field of a physical layer (PHY) protocol data unit (PPDU).

34. The wireless communication device of claim 26, wherein the modulation constellation comprises a quadrature amplitude modulation (QAM) constellation.

* * * * *